United States Patent
Connelly et al.

(10) Patent No.: US 6,891,234 B1
(45) Date of Patent: May 10, 2005

(54) TRANSISTOR WITH WORKFUNCTION-INDUCED CHARGE LAYER

(75) Inventors: Daniel J. Connelly, San Francisco, CA (US); Carl Faulkner, Belmont, CA (US); Daniel E. Grupp, Palo Alto, CA (US)

(73) Assignee: Acorn Technologies, Inc., Pacific Palisades, CA (US)

( * ) Notice: Subject to any disclaimer, the term of this patent is extended or adjusted under 35 U.S.C. 154(b) by 0 days.

(21) Appl. No.: 10/832,576

(22) Filed: Apr. 26, 2004

Related U.S. Application Data

(60) Provisional application No. 60/535,082, filed on Jan. 7, 2004.

(51) Int. Cl.[7] ............................................. H01L 31/119
(52) U.S. Cl. ...................... 257/407; 257/344; 257/408; 257/412
(58) Field of Search ................................ 257/407, 344, 257/408, 412

(56) References Cited

U.S. PATENT DOCUMENTS

| | | | | |
|---|---|---|---|---|
| 4,714,519 A | * | 12/1987 | Pfiester | 438/304 |
| 5,108,940 A | * | 4/1992 | Williams | 438/288 |
| 5,243,212 A | * | 9/1993 | Williams | 257/344 |
| 6,348,387 B1 | * | 2/2002 | Yu | 438/303 |
| 6,380,038 B1 | * | 4/2002 | Yu | 438/300 |
| 6,563,151 B1 | * | 5/2003 | Shin et al. | 257/288 |

* cited by examiner

Primary Examiner—Sara Crane
(74) Attorney, Agent, or Firm—Blakely Sokoloff Taylor & Zafman LLP

(57) ABSTRACT

An electrical switching device includes a semiconductor having a channel therein which is proximate to at least on channel tap in an extension region and also to a gate. A conductor (e.g., a metal) is disposed proximate to the extension region but is electrically isolated from both the extension region and the gate (e.g., through the use of one or more insulators). The conductor has a workfunction outside of the bandgap of a semiconductor in the extension region and therefore includes a layer of charge in the extension region. The magnitude and polarity of this layer of charge is controlled through selection of the metal, the semiconductor, and the insulator.

41 Claims, 16 Drawing Sheets

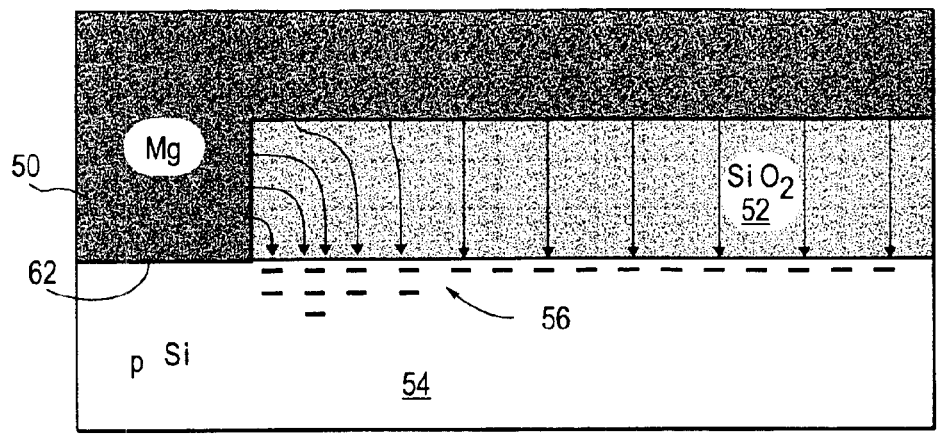
FIG. 4a
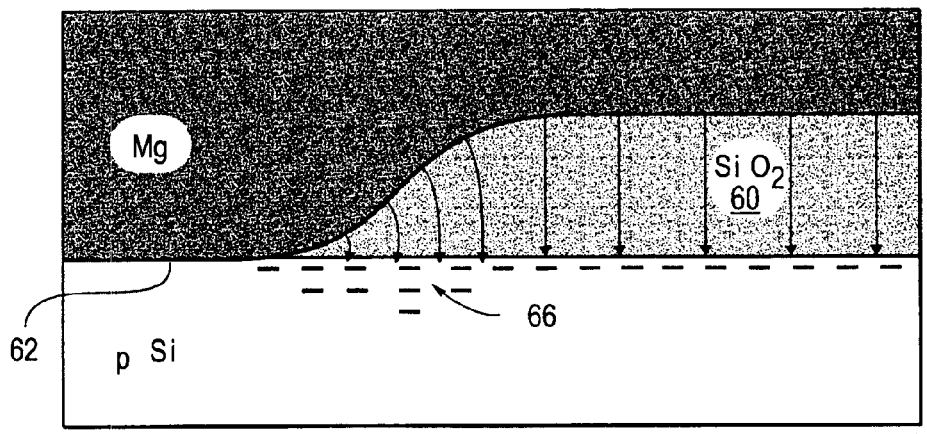
FIG. 4b
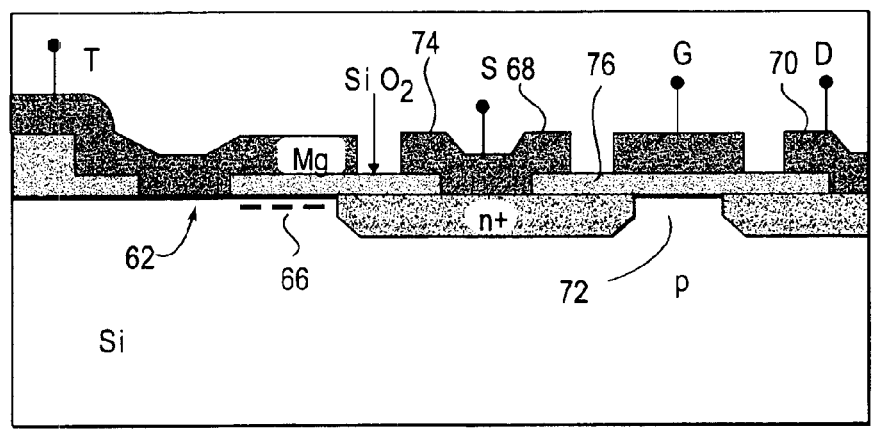
FIG. 4c
FIG. 4

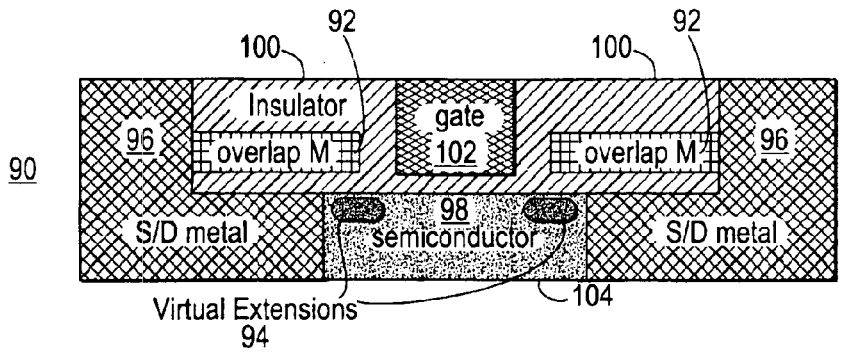
FIG. 6a
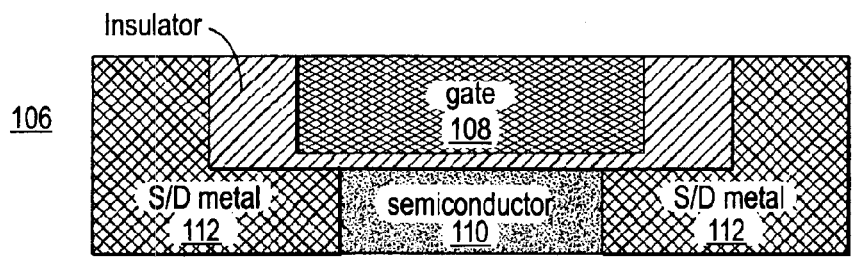
FIG. 6b
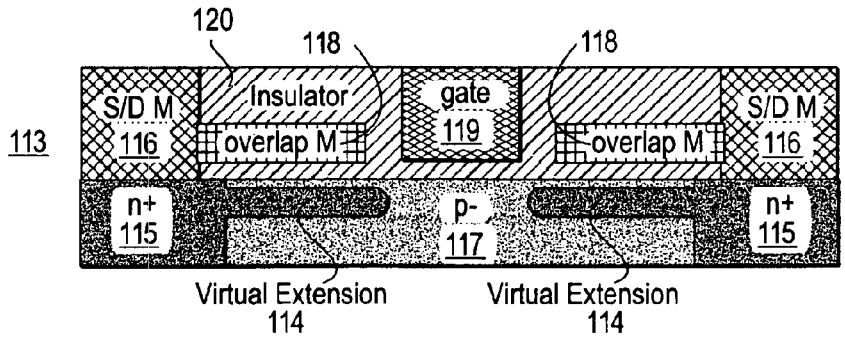
FIG. 6c
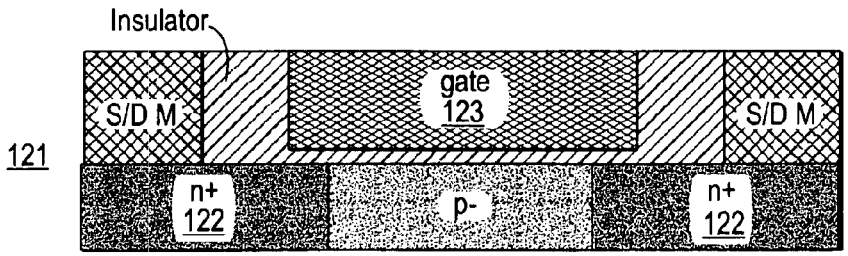
FIG. 6d
| FIG. 6a |
| FIG. 6b |
| FIG. 6c |
| FIG. 6d |
FIG. 6

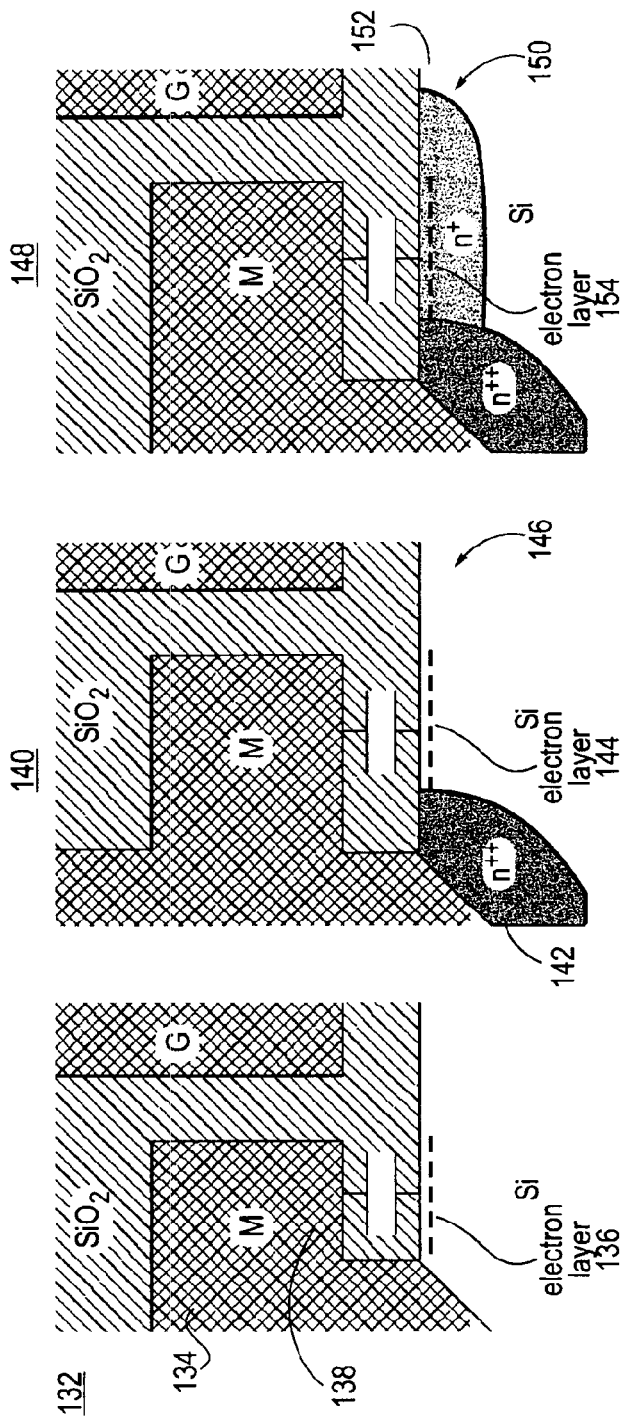

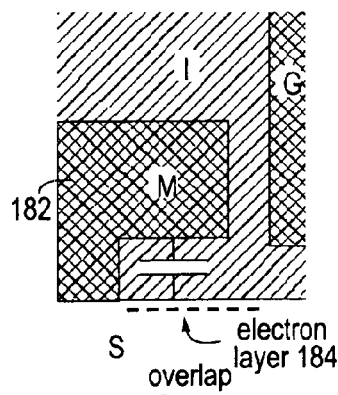
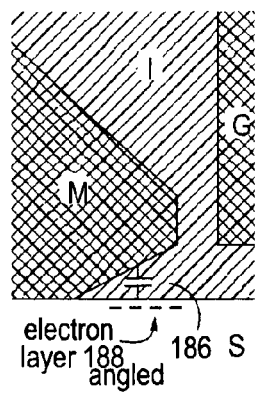
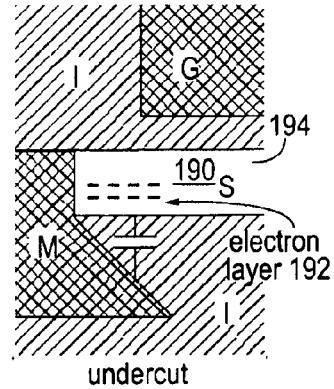
FIG. 13a overlap electron layer 184
FIG. 13b electron layer 188 angled
FIG. 13c undercut
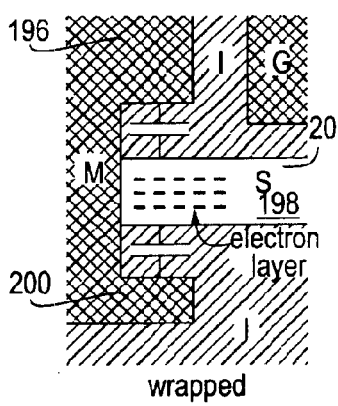
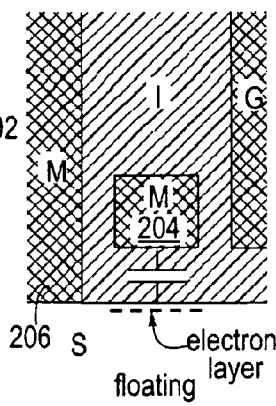
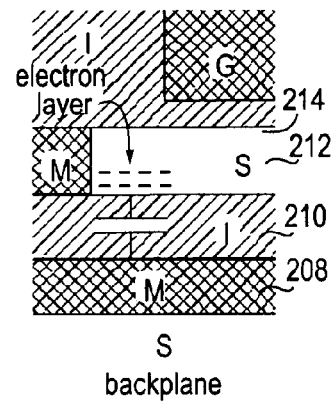
FIG. 13d wrapped
FIG. 13e floating
FIG. 13f backplane
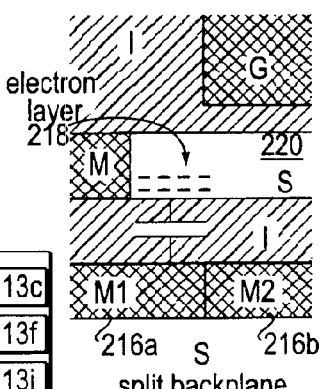
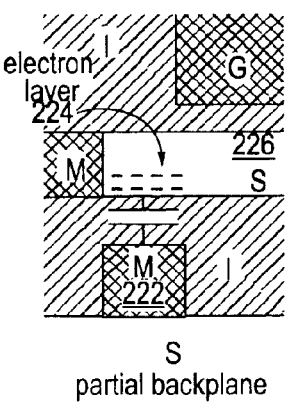
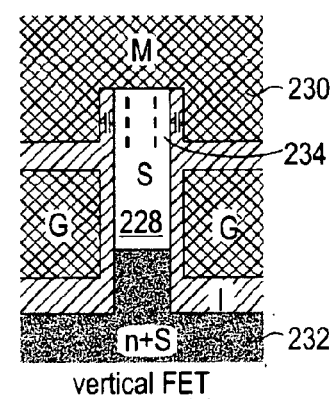
FIG. 13g split backplane
FIG. 13h partial backplane
FIG. 13i vertical FET (asymmetric)
FIG. 13

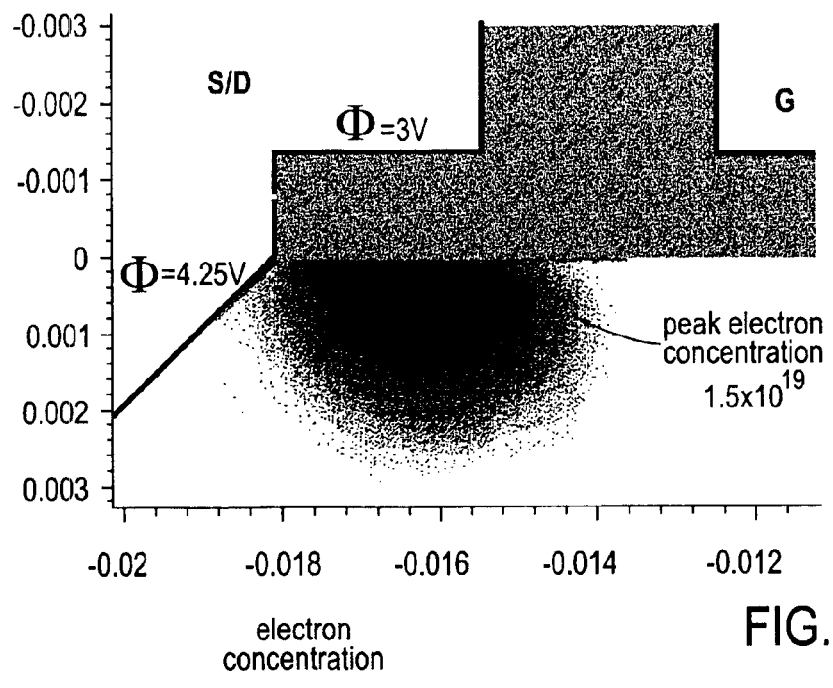
FIG. 15a
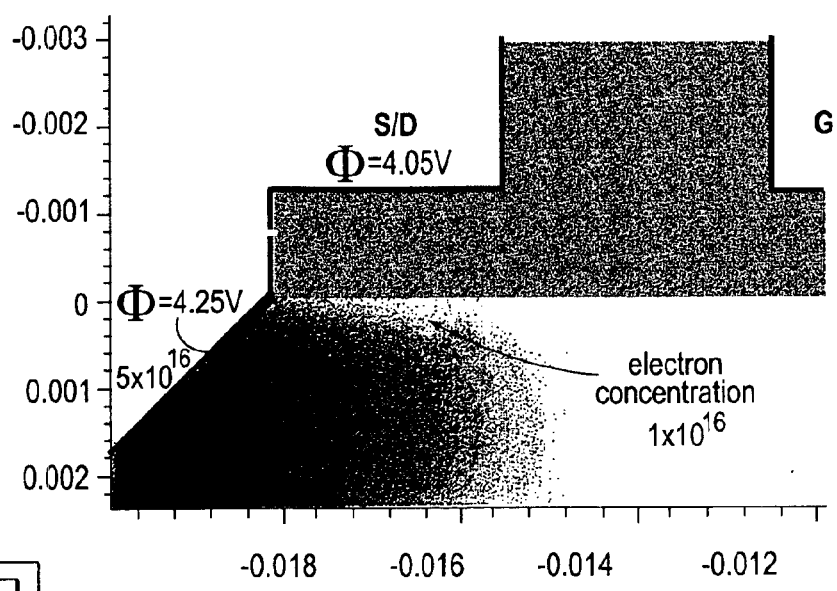
FIG. 15b
FIG. 15a
FIG. 15b
FIG. 15

TRANSISTOR WITH WORKFUNCTION-INDUCED CHARGE LAYER

RELATED APPLICATIONS

The present application is related to and hereby claims the priority benefit of U.S. Provisional Patent Application 60/535,082, entitled "Transistor with Workfunction-Induced Charge Layer", filed Jan. 7, 2004, incorporated herein by reference.

FIELD OF THE INVENTION

The present invention relates generally to solid-state switching and amplification devices and, more particularly, to a field-effect transistor having a layer of charge induced in the conduction path between the channel and one or more channel taps (the source and/or drain in a conventional field-effect transistor) by proximity to a conductor (e.g., a metal) possessing a workfunction outside of the bandgap of the semiconductor in the region in which the charge is induced.

BACKGROUND

As the gate length of transistors continues to shrink, the source (and/or drain) region(s) become(s) more of a factor in MOSFET (metal oxide semiconductor field effect transistor) performance. MOSFET scaling requires that the depth of the heavily doped regions at the source and/or drain be reduced, increasing the resistance of these regions relative to that of the channel. Furthermore, the geometry of the source/drain must be carefully engineered to avoid short-channel effects. These can most prominently be observed as high leakage currents in the off state.

There are a number of conventional techniques to address these issues of on-resistance and off-state leakage current. However, with virtually any design approach there are trade-offs between these two factors. For example, increasing the depth of a source region may reduce its on-resistance, but will increase the short-channel effects. Any solution typically seeks to optimize this trade-off based on the application.

In planar MOSFETs, the source and drain regions typically consist of implanted dopant atoms. To reduce the resistance of these regions, the dopant concentration can be increased. However, technological and physical limits to both the peak doping level and to the abruptness of doping profiles are limiting factors to MOSFET length scaling. See, e.g., M. Y. Kwong et al., "Impact of Lateral Source/Drain Abruptness on Device Performance", *IEEE Trans. Elec. Dev.*, vol. 49, pp. 1882–1890 (2002).

Another technique to reduce the source and/or drain resistance is the replacement of the implanted semiconductor regions forming the source and/or drain with a metal. Instead of a p-n junction, the metal forms a Schottky barrier at the interface to the channel. The resistance of the source and drain regions is then that of a metal, and not doped semiconductor, and hence may be orders of magnitude lower.

The limitation to such Schottky-barrier MOSFETs has been the resistance of the Shottky barrier that remains in the on-state of the transistor. See S. Sze, *Physics of Semiconductor Devices* $2^{nd}$ ed. (1981), for a discussion of Schottky barriers. For example, $ErSi_x$ has a barrier to the conduction band of Si of approximately 250 mV (see, M. Jang et al., "Schottky barrier tunnel transistor for nanometer regime applications", 2003 *Silicon Nanoelectronics Workshop Abstracts*, pp. 114–115 (2003)), yielding poor drive current (high on-resistance) for n-channel MOSFETs. Similarly, PtSi has a barrier to the valence band of approximately 250 mV (see, J. Kedzierski et al., "Complementary silicide source/drain thin-body MOSFETs for the 20 nm gate length regime", 2000 *IEEE IEDM Tech. Digest*, pp. 57–60 (2000)), increasing the on-resistance of p-channel MOSFETs.

When it comes to controlling short-channel effects, source/drain geometry becomes an important factor. Generally, it is desirable to make the source and drain regions much thinner than the length of the channel. In doped source/drain (S/D) transistors, this may be accomplished with shallow implants. A thin dopant layer may form a short "extension" between a deep, heavily doped source region and the (thin) channel. This has the effect of moving the deep source further from the channel to reduce the leakage current.

The challenge, and difficulty, is in making this dopant layer thinner while simultaneously increasing the doping density to keep the resistance within tolerable limits. The use of substrates such as silicon-on-insulator (SOI) may allow the doped source and drain to be kept thin by fabricating the transistor in a thin layer of Si, although ultra-thin SOI increases the problem of series resistance from doped Si. Schottky barrier MOSFETs may be fabricated using SOI to make very thin, yet low resistance, source and drain regions (again, at the possible expense of high on-resistance due to the Schottky barrier).

Geometries of a different sort may aid in decreasing the on-resistance of a Schottky barrier MOSFET. By overlapping the gate with the metal-semiconductor junction, the electric field between the source and/or drain and the gate can be used to increase the tunneling current through the barrier, lowering the on-resistance of the junction. This comes at the price of increased gate capacitance, however, which reduces switching speed. This also increases the short-channel effects.

Some of the above-described limitations may be overcome by creating an electrostatically induced extension between the source and/or drain contacts and the channel using so-called "side gate(s)". That is, a conductor, separate from the gate and separated from the channel/source (drain) region (the so-called "extension region(s)"), may be used to induce an inversion layer, and/or enhanced accumulation layer, in the semiconductor when a voltage is applied to the conductor. This is similar to the action of the gate itself, and the extra conductor(s) may be thought of as isolated or side gate(s) on either side of the central gate forming the channel. These side gate(s) may be controlled separately from the gate.

An example of the use of side-gates was reported by Gonzalez et al., "A dynamic source-drain extension (DSDE) MOSFET using a separately biased conductive spacer", Proceedings of 2001 *International Semiconductor Device Research Symposium*, pp. 645–648 (2001). FIG. 1 is a schematic cross-section of a transistor 10 incorporating the separately biased spacer technology described by Gonzalez et al. As shown, conductive spacers or side gates 12, separated from the gate 14 by an insulator 16 and from the source/drain regions 18 by a spacer oxide 20, induce a charge layer 22 (or "virtual extension") that extends from the doped source/drain regions 18 to the channel 24 when a voltage is applied to the side gates 12. These charge layers 22 (more aptly termed "bias induced extensions" in this instance) may be very thin, approximately 2 nm, reducing short-channel effects in the MOSFET 10. They may also have a high carrier concentration, for low resistance. They may even have a higher concentration than the channel 24 in the on-state, depending on the capacitance, threshold voltage, and side gate voltage.

An earlier, experimental, demonstration of this approach, using polycrystalline Si side-gates, was published by Noda, et al. (*IEEE Transactions on Electron Devices*, v. 41, pp. 1831–1836, 1994). There are two main limitations to such a device, however. First, the added circuit complexity (e.g., the side gates 12 and the metal contacts required thereto) may be prohibitive. Second, the side-gate(s) 12 add significant capacitance to the gate 14, which will limit the speed of the transistor.

Another approach is to use the proximity of a conducting material to increase the carrier concentration in the extension region. This method was demonstrated by Parillo et al., as shown in FIG. 2. Doped polycrystalline Si spacers 28 connected to the source 30 (the source-side spacer) and the drain 32 (the drain-side spacer). See, Parillo et al., "The effect of biased spacers on LDD MOSFET behavior", *IEEE Elec. Dev. Lett.*, vol. 12, pp. 542–545 (1991). For doping in the spacers 28 of the appropriate type and of sufficient concentration, this can yield an enhanced carrier concentration in the extension regions 31 and 33 relative to that which would be present without the spacers. The authors also reported reduced electric fields in the vicinity of the drain 32 by using a SALICIDE ("Self ALigned silICIDE") 34 over the source/drain spacer 28.

In transistor 26, the workfunction of the spacers 28 is near the workfunction of the extension region material (in this case Si). That is, the spacers 28 are not made of materials with workfunction significantly outside the Si bandgap; they are formed via TiSi (a mid-gap metal) on polycrystalline Si, hence a workfunction-induced extension is not formed in this device. Thus, while this approach may slightly enhance the conductivity of a traditional doped extension, it is not a substitute for a doped extension.

Bauernschmitt et al, "transition from MOS to Schottky-contact behaviour in Yb—SiO$_2$—Si tunneling junctions with extremely thin SiO$_2$ layer", *Microelectronic Engineering*, vol. 22, pp. 105–108, (1993) described the use of Yb over thick SiO$_2$ on Si to connect a Yb/SiO$_2$/Si tunnel junction to an n$^+$-doped contact. Yb's bulk workfunction is 2.6 V, according to the authors. The phenomenon of the tunneling of carriers between the metal and the workfunction-induced inversion layer was investigated at low temperature, and the characteristics of the Yb/thin SiO$_2$/Si tunnel junction were examined.

A figure from Bauernschmitt's paper is reproduced as FIG. 3. In this device 36, the Yb at the Yb/SiO$_2$ interface 38 induces an electron layer 40 near the Si/SiO$_2$ interface 42, which connects the Yb/thin SiO$_2$/Si tunnel junction 44 to the n$^+$ Si region 46. The reported device is not a transistor, but rather a two-terminal test structure.

Kunze et al. "Observation of ID electron states at the boundary between an MOS and a Schottky contact on Si(100) by electron tunneling", *Surface Science* vol. 305, pp. 633–636 (1994) formed workfunction-induced inversion layers in the vicinity of Mg/Si contacts, using Mg's low effective workfunction with SiO$_2$. Schematic cross-sections from the paper are reproduced in FIG. 4.

Illustration 4(*a*) shows an idealized structure 48 with rectangular material sections. Electrostatic coupling from the Mg layer 50, only weakly pinned at its interface with the SiO$_2$ layer 52, into the Si 54 yields a near-surface layer of electrons 56. Illustration 4(*b*) shows a more realistic structure 58, with the SiO$_2$ layer 60 thinned near the Mg/Si contact 62. This results in electron tunneling through the thin region of the SiO$_2$. Finally, illustration 4(*c*) shows a wider cross-section of the complete device 64. The workfunction-induced electron layer 66 connects the Mg/Si junction 62 to the source of this n-channel MOSFET.

Note the Mg induces an inversion layer in the Si, but this inversion layer is not between the source/drain contact 68/70 and the channel 72, and thus it is not serving as a virtual extension. There is some Mg overlap 74 of the SiO$_2$ 76 between the source/drain contact 68/70 and the channel 72, but the text of the article and its accompanying figures indicate is that this overlap is well within the region of the heavily doped source/drain. Thus, it fails to contribute significantly to the conductivity between the source/drain metal and the channel. For this overlap to be effective in increasing this conductivity, it should approach to within approximately 15 nm of the edge of the channel. See, D. Connelly et al., "Source/Drain Overlap for High-Performance Schottky S/D MOSFETs", submitted to *IEEE Nanotechnology Symposium*, 2004, and D. Connelly et al., "Ultra-shallow MOSFET Extensions via Low or High Workfunction Metal Overlap", submitted to *IEEE VLSI Symposium*, 2004. However, based on the description provided by the authors, this gap appears to be at least several micrometers—at least a factor 100 too large. Rather, the overlap is to provide a tolerance for misalignment for the metal definition photolithography relative to the preceding contact formation photolithography.

Tove et al. suggested the use of Er and Yb, both metals with effective workfunctions when in contact with SiO$_2$ significantly outside the Si bandgap, as MESFET gates and S/Ds. P. A. Tove, et al., "Complementary Si MESFET Concept Using Silicon-on-Sapphire Technology", *IEEE Elec. Dev. Lett.*, vol. 9, pp. 47–49 (1988). A cross-section from their work is shown in FIG. 5. Devices 78 and 79 are not fabricated in a manner effective at inducing a virtual extension; indeed, the diagram indicates the low-workfunction (n-channel FET) and high-workfunction (p-channel FET) metals 80 and 82, respectively, do not overlap the SiO$_2$ 84, and thus the electrostatic coupling between these metals and the region between the contacts 81 and 83 and the channels is low. Strong electrostatic coupling is needed to substantially improve the conductivity in this region. Additionally, given the lateral scale of the devices it appears that there is a gap between the S/D metals 81 and 83 and the gate metals 80 and 82 of at least several micrometers. This is far too large a gap to form a high-conductivity virtual extension to the edge of the channel. For effective coupling to the channel, the virtual extension layer should extend to within approximately 15 nm of the channel. See, D. Connelly et al., *IEEE VLSI Symposium*, 2004 (submitted), supra.

SUMMARY OF THE INVENTION

In an embodiment of the present invention, a transistor includes a layer of induced charge in a conduction path between a semiconductor channel and a channel tap, the conduction path being proximate to a conductor locally insulated from the layer of induced charge, and further insulated from a gate of the transistor. The conductor possesses a workfunction outside of a bandgap of a semiconductor in a region of the transistor in which the charge is induced. In embodiments of the present inventions, conductivity between the semiconductor channel and the channel tap may be enhanced by at least approximately 10% relative to a reference case where the conductor has a workfunction within or at a boundary of the bandgap of the semiconductor in the region of induced charge.

The channel tap may be a doped source/drain contact, a metal source/drain contact, or, more generally, any Schottky source/drain contact. The semiconductor channel may be made of Si, Ge, C, alloys of Si, Ge and/or C, a compound of Group IIIA and Group VA elements, an alloy of Group IIIA and Group VA elements, a compound of Groups IIA–B and Group VIA elements, an alloy of Groups IIA–B and Group VIA elements, a compound of Groups IIA–B, Group IIIA, Group IVA, Group VA, and/or Group VIA elements, an alloy of Groups IIA–B, Group IIIA, Group IVA, Group VA, and/or Group VIA elements, a semiconducting polymer, fulleride, or other molecular carbon-based material.

The conductor may be a metal (e.g., consisting of one or more rare earth elements) such as Er, Yb, Mg, Pt, Ir or alloys of any of the above, as determined by atomic fraction. Alternatively, the conductor may be a degenerately-doped n-type or p-type semiconductor. In some embodiments, the conductor is configured to induce strain in the region of the transistor in which the charge is formed. The induced strain enhances effective carrier mobility in the region of the transistor in which the charge is formed.

In various embodiments, the conductor may be electrically connected to or isolated from the channel tap and may have a workfunction no greater than 0.2, 0.4, 0.8, or 1.6 volts below an electron affinity or more than a bandgap greater than an electron affinity of the semiconductor in the region of the transistor in which the charge is induced. An insulator which separates the conductor from the layer of induced charge may have a thickness less than or approximately equal to twice the thickness of a second insulator which separates the gate from the semiconductor channel. Viewed differently, the insulator which separates the conductor from the layer of induced charge may have a per-area capacitance greater than or approximately equal to half the per-area capacitance of the insulator which separates the gate from the semiconductor channel.

In accordance with a further embodiment of the present invention, an electrical switching device includes a semiconductor having a channel therein, said channel being proximate to at least one channel tap in an extension region and also to a gate of the electrical switching device; and a conductor disposed proximate to the extension region but separated therefrom by an insulator, the conductor also being electrically isolated from the gate and having a workfunction outside of a bandgap of the semiconductor in the extension region. The semiconductor may be selected from a list comprising: Si; Ge; C; alloys of Si, Ge and/or C; a compound or alloy of Group IIIA and Group VA elements; a compound or alloy of Groups IIA–B and Group VIA elements; a compound or alloy of Groups IIA–B, Group IIIA, Group IVA, Group VA, and/or Group VIA elements; and/or a polymer. The conductor may be selected from a list comprising: a rare earth element (including but not limited to Er or Yb), Mg, Pt, Ir, an alloy of primarily any combination of these materials, an alloy or compound of any of these metal(s) and one or more semiconductor(s), a degenerately-doped n-type semiconductor, and/or a degenerately-doped p-type semiconductor.

A further embodiment provides for inducing a layer of charge in a conduction path between a channel of a semiconductor and a channel tap of an electrical switching device incorporating: the semiconductor by proximity to a conducting material insulated from the channel and a gate and having a workfunction outside of a bandgap of a semiconductor in the conduction path in which the charge is induced.

BRIEF DESCRIPTION OF THE DRAWINGS

The present invention is illustrated by way of example, and not limitation, in the figures of the accompanying drawings, in which:

FIG. 4 shows the use of an Mg/SiO$_2$/Si junction to create a workfunction-induced electron layer as reported by Kunze et al.

FIG. 6 provides a comparison of transistors configured in accordance with embodiments of the present invention with MOSFET having overlapping gate structures.

FIG. 8 shows various cross-sections of transistor doping strategies for use in accordance with embodiments of the present invention.

FIG. 13 illustrates a number of examples of source/drain-extension region geometries for transistors configured in accordance with various embodiment s of the present invention.

FIG. 15 provides a comparison of simulated electron density profiles for fully-depleted silicon-on-insulator n-channel MOSFETs with overlap metals of different effective workfunctions in accordance with embodiments of the present invention.

DETAILED DESCRIPTION

Figure 1:
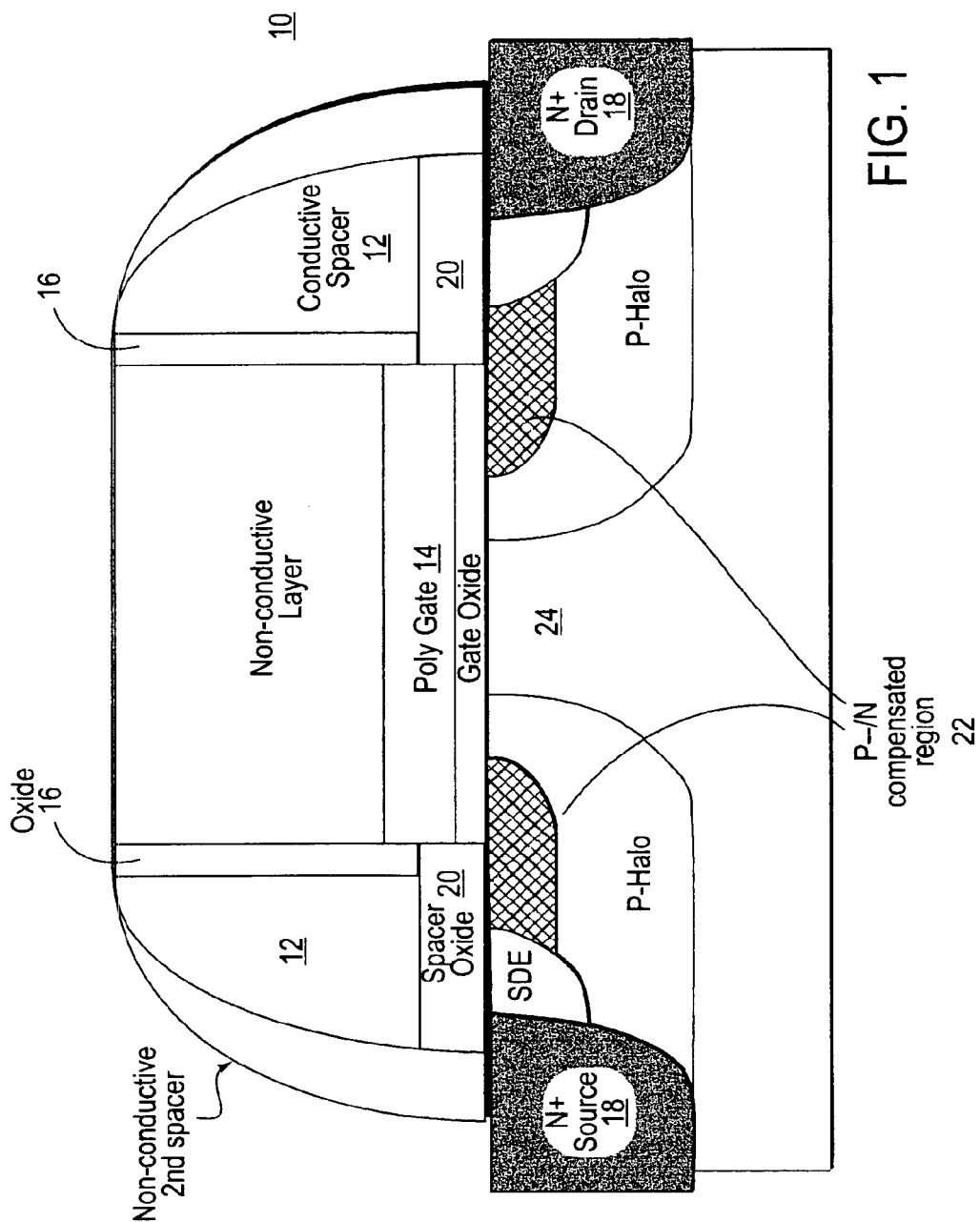
FIG. 1 illustrates a schematic cross-section of a transistor having separately biased spacer technology described by Gonzales, et al.
Figure 2:
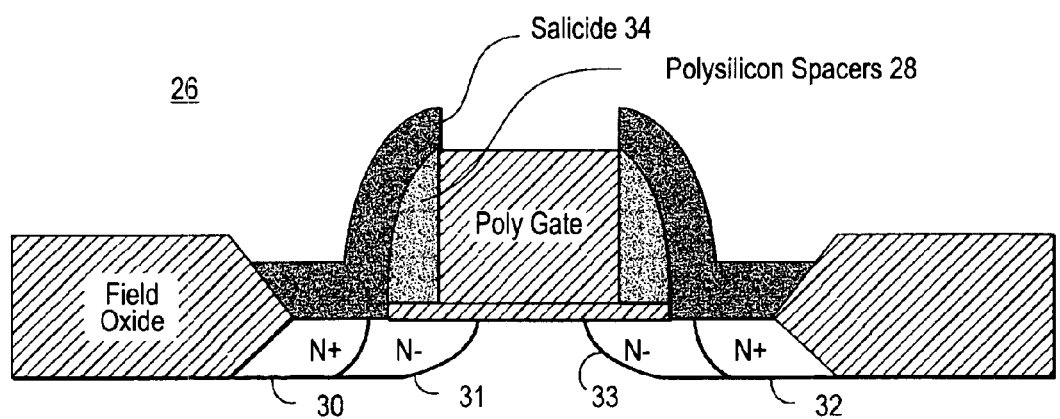
FIG. 2 illustrates the biased spacer device described by Parillo et al.
Figure 3:
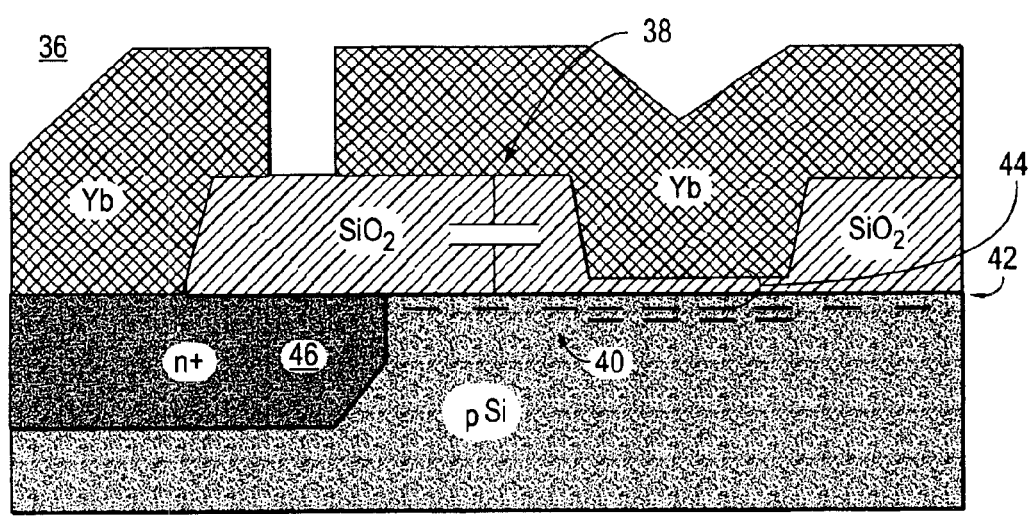
FIG. 3 illustrates the use of a Yb/SiO$_2$/Si junction to create a workfunction-induced electron layer as reported by Bauernschmitt et al.
Figure 5:
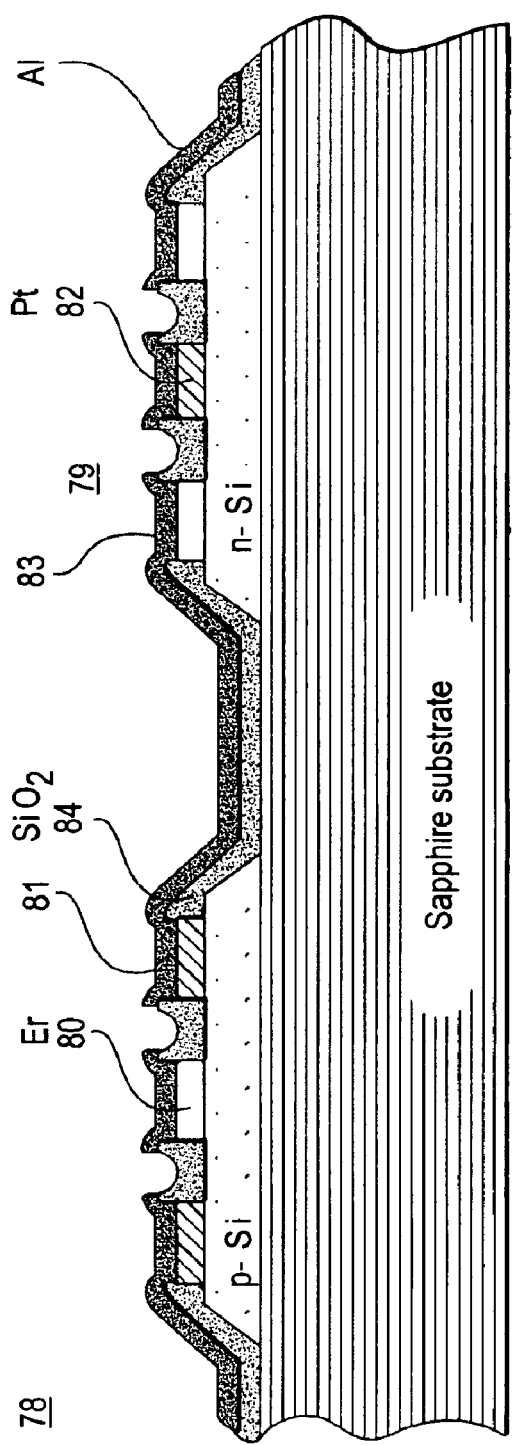
FIG. 5 shows the use of Er and Yb gates in MESFETs as reported by Tove et al.

As is discussed in detail below, the present inventors have developed a FET that includes an extension region which is sufficiently shallow, has a high charge density for low resistance, does not suffer from the decrease in performance (in particular switching speed) as has been reported for other FETs, and does not add significantly to circuit complexity. More specifically, disclosed herein is an electrical switching device (a transistor) that includes one or more conductors (which often will be a metal), each of which overlaps a region of semiconductor between a channel tap (for example, source or drain) region and the channel region. This region of semiconductor, part or all of which is overlapped by the conductor, is a so-called "extension region". Furthermore, each of these conductor(s) is locally separated from the semiconductor it overlaps by an insulator. Each conductor is electrically isolated from the gate(s) and is chosen to have a workfunction that will induce a desired polarity and concentration of charge in the associated extension region.

The effect of the conducting material in the extension region is to induce a layer of charge at or near the surface of the semiconductor under the insulator. This charge is the result of the conductor possessing a workfunction that differs from that of the semiconductor. The workfunction difference acts as a voltage across the capacitor formed by the conductor/insulator/semiconductor layer structure in the extension region. This voltage then results in the capacitor becoming charged. Charge builds up in the capacitor until a potential is reached which is about equal and opposite to the workfunction difference. At that point the chemical potential across the capacitor is constant (the potential from the charge built up cancels the potential from the workfunction difference) and no further charge flows, with the system in equilibrium. In embodiments of the present inventions, conductivity between the semiconductor channel and the channel tap may be enhanced by at least approximately 10% relative to a reference case where the conductor has a workfunction within or at a boundary of the bandgap of the semiconductor in the region of induced charge.

The principle of inducing charge in a capacitor formed with a semiconductor has been described by several groups. Bauernschmitt et al., supra, demonstrated that an inversion layer could be induced in Si by using a low-workfunction metal, such as Yb. Kunze et al., supra, utilized the same phenomenon in a structure with Mg, and Tove, et al., supra, suggested the use of Er and Yb as MESFET gates and S/Ds. However, the inversion layers in these prior structures were not utilized as part of a FET, and in particular not as an extension between a source/drain contact and a channel.

In a FET with the conducting layer overlapping an insulator over the semiconductor, the induced layer of charge acts as an extension linking the source and/or drain contact region with the channel region of the transistor. This layer of charge is termed a "virtual extension", because it is not the result of dopant atoms in the extension region, but induced by a conductor not in direct contact with the semiconductor in the extension region. The thickness of the virtual extension will be significantly less than practical present techniques have accomplished with doped extension regions in, for example, silicon or germanium.

The total charge induced in the virtual extension is in many cases roughly in proportion to the workfunction difference of the conductor and the semiconductor in the extension region. The resistance of the virtual extension then decreases as the amount of induced charge increases as the workfunction difference increases. That is, in many cases, the larger the workfunction difference between the semiconductor and the conductor in the extension region, the lower the resistance. The sign of the charge is related to the sign of the workfunction difference. Thus, within the present transistor the conductor is separated from both the gate and the extension region by an insulator and is chosen to have a workfunction that will induce a desired polarity and concentration of charge in the extension region. The insulator which separates the conductor from the layer of induced charge may have a thickness less than or approximately equal to twice the thickness of the insulator which separates the gate from the semiconductor channel. Viewed differently, the insulator that separates the conductor from the layer of induced charge may have a per-area capacitance greater than or approximately equal to half the per-area capacitance of the insulator that separates the gate from the semiconductor channel.

The remaining discussion will present several embodiments of this invention, but this discussion is not meant to limit the scope of the invention. By studying the present disclosure others of ordinary skill in the art may recognize equivalent procedures, materials or structures that can be substituted for those described herein to achieve the same effect. The reader is advised that the use of such equivalents is deemed to be within the scope of the present invention. Prior to beginning this discussion in detail it is helpful to introduce the following definitions:

1. accumulation layer: A region in which the expected number of ionized acceptors is greater than the expected number of ionized donors, and the expected hole concentration is greater than the value expected for a bulk crystal at the same doping in equilibrium. Also, a region in which the expected number of ionized donors is greater than the expected number of ionized acceptors, and the expected electron concentration is greater than the value expected for a bulk crystal at the same doping in equilibrium. See also "strong accumulation layer".
2. affinity: The difference between the vacuum potential and the potential of the state(s) of maximum (for a valence band) or minimum (for a conduction band) energy in a semiconductor. The "electron affinity" is the affinity of the lowest-energy conduction band. The "hole affinity" is the affinity of the highest-energy valence band.
3. bandgap: In a semiconductor, one of the following: (1) The difference in energy between the lowest energy states in the conduction band(s), and the highest energy states in the valence band(s), typically measured in "electron volts". (2) The potential difference between the lowest energy states in the conduction band(s), and the highest energy states in the valence band(s), typically measured in "volts". (3) The range of potentials and/or energies between those associated with the lowest energy states in the conduction band(s) and the highest energy state in the valence band(s).
4. bias-induced extension: A virtual extension which is insignificant at equilibrium, but requires a potential be applied to a nearby conductor, electrostatically coupled to the region of the virtual extension.
5. channel: The region of charge in a FET which is largely controlled by the potential of the gate electrode and is electrically connected to two or more channel taps.
6. channel tap: A connection between a metal conducting material and one or more channels of a FET. "Conventional" FETs have two channel taps, a "source" and a "drain". A channel tap can also be generically referred to as a "source/drain" or "S/D".
7. conducting contact: A contact between two conducting materials in which, for some voltage typically encountered in device operation, in conditions of typical device operation, the average specific resistivity of the contact is no more than approximately $10^8$ $\Omega$-$\mu m^2$. The contact may be direct, in which the two materials touch, or indirect, in which an intervening layer is placed at their interface.

8. conductor/conducting material: Either a metal or a semiconductor.

9. conduction band: In a semiconductor, a band of states with energy above the Fermi energy of the semiconductor in the absence of impurities in equilibrium. See, also, "valence band".

10. degenerately-doped semiconductor: A region of semiconductor in which the net doping is n-type and the difference between the donor and acceptor concentrations is at least as large as the effective conduction band density of states of the semiconductor. Also, a region of semiconductor in which the net doping is p-type and the difference between the acceptor and donor concentrations is at least as large as the effective valence band density of states of the semiconductor.

11. doped channel tap: A channel tap where rectification between the region of the channel and the metal contact is determined primarily by the doping in the region of the contact. If the doping in the vicinity of the contact is primarily donor ions, electrons are relatively more readily exchanged with the channel region than are holes, and the channel tap will be typically suitable for use in n-channel FETs. If the doping in the vicinity of the contact is primarily acceptor ions, holes are relatively more readily exchanged with the channel region than are electrons, and the channel tap will be typically more suitable for use in p-channel FETs. The interface between the metal and the semiconductor is then typically such that it provides a relatively low resistance exchange of carriers of the channel type, with or without a comparably free exchange of the opposite carrier type.

12. doped source/drain (S/D) FET: A FET where the source and drain are doped channel taps, with the doping of the source determining the device polarity. Variants include a "doped source FET", with a doped source, but not necessarily doped drain. Another variant is a "doped drain FET", with a doped drain, but not necessarily a doped source.

13. doped extension: An extension formed by the placement of ionized impurities of the appropriate polarity in the region of the extension.

14. drain: Typically the channel tap(s) which act as a sink for carriers from the channel. Thus it tends to be held at the highest (n-channel FET) or lowest (p-channel FET) electrostatic potential of all of the channel taps.

15. effective workfunction: The value experimentally extracted for the workfunction of a metal in contact with another material, under the assumption the metal at the interface is an equipotential surface defined by an effective workfunction. For a metal in contact with an insulator, capacitance versus voltage of a metal-insulator-semiconductor capacitor can be analyzed for a variety of insulator thicknesses, the effective metal workfunction, and the effective fixed charge density of the insulator/semiconductor interface, can be determined. See, for example, Section 6.2 of D. Schroeder, *Semiconductor Material and Device Characterization* $2^{nd}$ ed. (1998). In the absence of data using the actual insulator associated with the metal/insulator interface in question, metal-SiO$_2$-semiconductor structures can be used. Data from metal-insulator-Si test structures can be used, if data for metal-insulator-semiconductor test structures, where the semiconductor is that in the region of the suspected electrostatic coupling, is not available. If none of these are available for the effective workfunction of the metal/insulator interface, a respected published value can be used, with, if it is available, a model for the Fermi level pinning associated with the insulator (such as described in Y. C. Yeo, et al., "Effect of High-k Dielectrics on the Workfunctions of Metal and Silicon Gates", 2001 *IEEE Symposium on VLSI Technology Tech. Digest*, pp. 49–50 (2001) or Y. C. Yeo, et al., "Effects of high-k Gate Dielectric Materials on Metal and Silicon Gate Workfunctions", *IEEE Elec. Dev. Lett.*, vol. 23, pp. 342–344 (2002)). If such a model is not available for the insulator, experimentally derived pinning parameters associated with SiO$_2$ can be used (see id.). For metal in contact with a semiconductor, whether direct or through an ultra-thin interfacial layer, current-voltage characteristics can be modeled. See, e.g., Section 3.5 of *Schroeder*, supra.

16. electrically connected: Two metal regions are said to be electrically connected if current can flow between them with an equilibrium resistance of no more than approximately 100 $\Omega$, and if at least some of the current flows along a path which consists, with the possible exception of ultra-thin interfacial layers, exclusively of metals and/or semiconductor regions where the semiconductor region(s) have equilibrium carrier concentrations of at least $10^{19}$/cm$^3$. Regions which are electrically connected are considered to be "in electrical contact".

17. electron: For purposes of this work, "electrons" (or "free electrons") are the quantum states of a negative charge quantum which directly contribute to conductivity of a conductor. See also "hole".

18. equilibrium: The state of a device where all terminals are at equal voltage bias (typically, by definition, "0 volts"), and the system, including the local device environment, is in a state of isothermal equilibrium, typically at or near 300 K.

19. extension: A region of charge of the same type as the channel, not substantially controlled by the gate electrode, between the channel and a channel tap.

20. extension region: The region between a channel tap (e.g., a metal/semiconductor contact) and a channel.

21. field-effect transistor (FET): A device which consists of one or more gates (conventionally one) which modulate the conductivity of one or more channels (conventionally one) to which two or more channel taps (conventionally two) are connected. In an n-channel FET, the channel(s) consist(s) primarily of electrons. In a p-channel FET, the channel(s) consist(s) primarily of holes. In an ambipolar FET, the channel(s) can be either electrons or holes.

22. gate: A FET electrode which controls the charge density in one or more channels.

23. hole: For purposes of this work, "holes" (or "free holes") are the quantum states of a positive charge quantum which contribute to conductivity of a conductor. See also "electron".

24. insulator: A region which in the bulk limit has a negligible conduction of free electrons and/or free holes, for example having a bulk resistivity of comparable to or greater than $10^8$ Ω-cm². This includes solid, liquid, and gas phase materials, in addition to the absence of significant material (e.g., a vacuum).

25. inversion layer: A region in which the expected number of ionized acceptors is at least as high as the expected number of donors, and the expected electron concentration is greater than the expected hole concentration. Also, a region in which the expected number of ionized donors is at least as great as the expected number of ionized acceptors, and the expected hole concentration is greater than the expected electron concentration. A region which is part of an inversion layer is defined to be in a state of inversion. See also "strong inversion layer".

26. metal channel tap: A channel tap where rectification between the region of the channel and the metal contact is determined primarily by the metal workfunction relative to the potentials of the semiconductor conduction band and/or valence band. If the workfunction is less than the semiconductor electron affinity, or much less than half the semiconductor bandgap greater than the electron affinity, electrons are relatively passed and holes are relatively blocked by the contact, and the contact will be typically suitable for use in an n-channel FET. If the workfunction is much more than half a semiconductor bandgap greater than the semiconductor electron affinity, holes will be generally passed by the contact more readily than electrons, and the contact will be typically suitable for use in p-channel FETs.

27. metal source/drain (S/D)) FET: A FET in which the device polarity (n-channel, p-channel, or ambipolar) is determined by whether electrons or holes or both are relatively efficiently transported across metal/semiconductor contacts at the source and drain. For a FET with three or more taps, the taps serving as the source and drain should be of this nature. Variants include asymmetric "metal source" and "metal drain" FETs, in which the source (metal source FET) or drain (metal drain FET) are of this nature.

28. Schottky contact: A direct contact between a metal and a semiconductor.

29. Schottky source/drain (S/D) FET: A metal source/drain FET in which the source and drain consist of direct contacts between metal and semiconductor. Variants include a Schottky source FET and Schottky drain FET. See also "metal source/drain FET".

30. short-channel effects: Effects due to the conductivity of the channel being affected by electrostatic coupling between the channel and the source and/or drain. These generally reduce the ability of the gate to reduce the source-to-drain current to some threshold, for appropriate drain-to-source biases (high for n-channel FETs, low for p-channel FETs). Other effects associated with short channels, such as non-equilibrium transport, are not included in this definition.

31. source: A tap to the channel of a field-effect transistor; typically held at a lower potential in the case of an n-channel transistor, or at a higher potential in the case of a p-channel transistor, than the other channel tap(s). It thus acts as the source of carriers which are supplied to the channel. Typically the goal is to minimize the extrinsic resistance associated with the transport of carriers of the type which form the channel between the source and the channel, but have a high resistance to the carrier of the opposite type.

32. source/drain (S/D): A channel tap.

33. strong accumulation layer: A region of an accumulation layer where the quasi-Fermi level associated with the accumulation carrier is at least three times as close to the associated carrier band (conduction for electrons, valence for holes) than it is to the semiconductor intrinsic potential, and where this concentration is at least 3 times greater than the value expected for a bulk crystal at the same doping in equilibrium. The quasi-Fermi level restriction corresponds to (using values from Sze, supra) an accumulation carrier density of at least $\sqrt[4]{n_i N_C^3}$ in the case of electrons, $\sqrt[4]{n_i N_V^3}$ in the case of holes, where $n_i$, $N_C$, and $N_V$ are the intrinsic carrier concentration, the effective conduction band density of states, and the effective valence band density of states, locally associated with the semiconductor. Typical values of this carrier concentration in Si, at room temperature are $6.3 \times 10^{16}/cm^3$ for holes, and $1.3 \times 10^{17}/cm^3$ for electrons. A region that is part of a strong accumulation layer is in a state of strong accumulation.

34. strong inversion layer: A region of an inversion layer where the quasi-Fermi level associated with the inversion carrier is at least three times as close to the associated carrier band (conduction for electrons, valence for holes) than it is to the semiconductor intrinsic potential. This corresponds (using values from Sze, supra) to an inversion carrier density of at least $\sqrt[4]{n_i N_C^3}$ in the case of electrons, $\sqrt[4]{n_i N_V^3}$ in the case of holes, where $n_i$, $N_C$, and $N_V$ are the intrinsic carrier concentration, the effective conduction band density of states, and the effective valence band density of states, locally associated with the semiconductor. Typical values of this carrier concentration in Si (using values from Sze, supra), at room temperature are $6.3 \times 10^{16}/cm^3$ for holes, and $1.3 \times 10^{17}/cm^3$ for electrons. A region that is part of a strong inversion layer is in a state of strong inversion.

35. ultra-thin interfacial layer: For purposes of this discussion, when a material between two other materials (effectively at their interface) is said to be "ultra-thin", it implies that the three-material stack behaves similarly to an interface between the outer two material types, albeit with characteristics which may differ from those of a direct contact between the two specific outer materials. For example, a contact of Yb with Si behaves as a metal/semiconductor contact. Adding interfacial $SiN_x$ a few monolayers thick can yield a structure that also behaves like a metal/semiconductor contact, except with a lower thermionic barrier than is present in the direct contact. See D. Connelly et al., "A New Route to Zero Barrier Schottky S/D CMOS", 2003 *Silicon Nanoelectronics Workshop Abstracts*, pp. 122–123 (2003).

36. valence band: in a semiconductor, a band of states with energy below the Fermi energy of the semiconductor in the absence of impurities in equilibrium. See, also, "conduction band".

37. virtual extension: an extension formed by means other than the placement of impurities in the region of the extension. In this discussion, the virtual extension is formed by the proximity of conducting/insulating boundaries of appropriate effective workfunction and/or potential.

38. workfunction-induced extension: a virtual extension formed by the proximity of conducting/insulating boundaries of appropriate effective workfunction, existing even in equilibrium.

Referring now to FIG. 6, a comparison between transistors configured in accordance with the present invention and other transistor structures having overlapping gates is shown. As indicated above, the present transistor 90 (an example of which is shown in Illustration 6(a)) includes a conductor (in this case a metal) 92 that overlaps an extension region 94 between the source and/or drain regions 96 and the channel region 98. This conductor 92 is separated from the extension region 94 by an insulator 100 and is chosen to have a workfunction that will induce a desired polarity and concentration of charge in the extension region 94. The conductor 92 is not connected to the gate 102, but is electrically isolated therefrom.

In illustration 6(b), a conventional FET 106 having a gate 108 which overlaps the metal/semiconductor S/D junctions 112 is shown for comparison purposes. In transistor 90 (shown in illustration 6(a)), however, a conductor 92 with a workfunction outside the semiconductor bandgap overlaps this junction instead. The conductor 92 in this example is electrically connected to the S/D contact 96. The location of the induced "virtual extensions" 94 is indicated. Doping may or may not be present in the semiconductors 104 and 110. The use of the overlapping conductor in accordance with the present invention allows for shorter channel lengths than is the case for overlapping gate structures.

In illustrations 6(c) and 6(d), doped S/D n-channel MOSFETs are compared. In illustration 6(c), transistor 113, configured in accordance with an embodiment of the present invention, has virtual extensions 114 from the n$^+$S/D regions 115 that result from the use of the overlapping metal 118. These metal layers 118 are connected to the metal S/D contacts 116 and are separated from the extension regions 114 and the gate 119 by an insulator 120. The ultra-shallow (comparable to the thickness of the channel 117) virtual extensions 114 are consistent with more aggressive gate length scaling than the gate-to-S/D overlap structure 121 represented in illustration 6(d). Transistor 121 includes a gate 123 that overlaps the n$^+$S/D regions 122. Thus, in various embodiments, the conductor responsible for inducing the layer of charge may be electrically connected to or isolated from the channel tap and (as discussed further below) may have a workfunction no greater than 0.2, 0.4, 0.8, or 1.6 volts below an electron affinity or more than a bandgap greater than an electron affinity of the semiconductor in the region of the transistor in which the charge is induced.

The key parameter associated with the conductor used to overlap the extension region is its effective workfunction at its interface with the insulator. The effective workfunction of a metal at its interface with another material depends on the material with which it is in contact. J. Tersoff, "Schottky Barrier Heights and the Continuum of Gap States", *Physical Review Letters* vol. 52, pp. 465–468 (1984). This effective workfunction tends to be closer to the workfunction of a "bulk" crystal if the other material is an insulator, such as SiO$_2$. See Yeo et al., supra (two references). In the case of SiO$_2$, the effective workfunction of the interface can be quite close to the bulk workfunction. Further, the insulator may be advantageously of sufficient thickness to remove intrinsic surface states from the semiconductor. This prevents the induced charge in the extension region from primarily occupying localized or extended surface states within the semiconductor bandgap. In the absence of surface states the charge will more likely occupy states in the semiconductor conduction or valence bands. This may help conduction from the extension region to the channel region when the FET is on and the channel region is conducting.

In one embodiment of the present invention, the conductor used to overlap the extension region is a metal possessing a low workfunction $\Phi_x$ in an n-channel FET. This effective workfunction is considered low when it is less than the electron affinity $X_c$ of the semiconductor. It is generally advantageous to have $\Phi_x$ as low as possible. The lower the workfunction, the greater the amount of charge (in this case electrons) induced in the extension, which generally reduces the resistance of the extension region, generally advantageously increasing the drive-current capability of the transistor.

However, for a given per-area capacitance of the insulator separating the metal from the extension region (this capacitance including a component from the semiconductor), there may be an optimal effective metal workfunction, if for lower (n-channel FET) or higher (p-channel FET) effective workfunctions, an increase in the electric field in the extension region results in a mobility decrease which cancels the conductivity advantages of increased induced charge. Similarly, for a given metal effective workfunction, the dependence of carrier mobility on electric field may yield an optimal insulator per-area capacitance. An example of the electric field dependence of electrons and holes at semiconductor/insulator interfaces is described by S. Takagi, et al., "On the Universality of Inversion Layer Mobility in Si MOSFET's" (parts I and II), *IEEE Transactions on Electron Devices*, vol. 41, pp. 2357–2368 (1994). Simply maximizing the conductance between the induced charge layer (the "virtual extension") and the channel may not minimize the resistance between the source/drain metal and the channel, however. For example, the higher electric fields associated with a higher local charge density may result in a reduction in the resistance associated with the metal/semiconductor interface at the source/drain contact. The reduction in this resistance may result in a reduced net resistance, even if the electric fields in the extension region are larger than those that would optimize the conductivity between the extension region and the channel, due to the previously mentioned mobility dependence on electric field. So optimizing device performance may involve a competition between numerous phenomena.

Carrier mobility can also be affected by the strain state of a semiconductor. For example, effective mobilities in silicon channels have been shown to increase when the silicon is placed in a state of biaxial tension, as described in "Strain dependence of the performance enhancement in, strained-Si n-MOSFETs", J. Welser et al., 1994 *IEEE IEDM Tech. Digest*, pp. 373–376. Thus, it may be advantageous to engineer a device in which the extension region is in a preferred strain state. For example, the conducting material may be formed in a fashion so that the conducting material is strained, inducing strain in a semiconductor of the nearby extension region.

Figure 7:
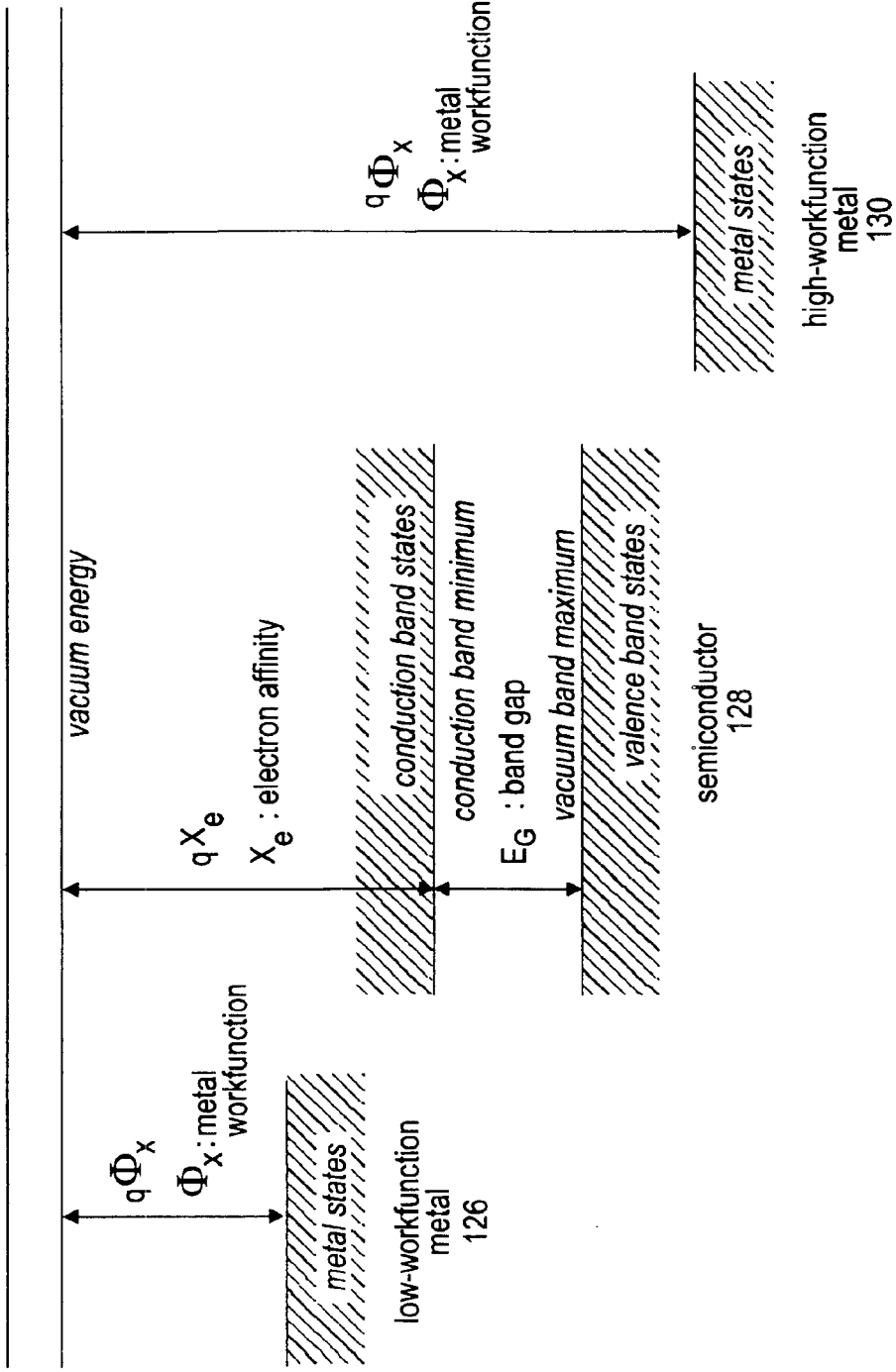
FIG. 7 illustrates graphically the band parameters associated with low-workfunction metals, semiconductors and high-workfunction metals.

As illustrated graphically in FIG. 7, potential is measured from the vacuum so that a low workfunction lies outside the bandgap of the semiconductor. More specifically, the figure shows a comparison of band parameters associated with a low-workfunction metal 126, a semiconductor 128, and a high-workfunction metal 130. The low-workfunction metal 126 has $\Phi_x < X_e$ of the semiconductor 128, while the high-workfunction metal 130 has $\Phi_x > X_e + E_G/q$ of the semiconductor 128.

In another embodiment of the present invention, the workfunction $\Phi_x$ of the metal is high in a p-channel FET, where $\Phi_x$ is greater than the hole affinity of the semiconductor (i.e., more than a bandgap greater than the semiconductor's electron affinity). The overlapping metal in this case induces holes in the extension region. It is generally advantageous to have a metal with as high a workfunction as possible. The workfunction of the metal lies outside of the semiconductor bandgap.

In various embodiments of the present invention, the semiconductor may consist of any of Si, Ge, C, an alloy of Ge and Si, an alloy of Ge and C, an alloy of Si and C, or an alloy of Si, Ge, and C, a compound which consists primarily of Group IIIA and Group VA elements, a compound which consists primarily of Groups IIA–B and Group VIA elements, or a compound consisting primarily of Groups IIA–B, IIIA, IVA, VA, and VIA elements. If primarily C, the crystal structure may be either a diamond lattice, or another bonding scheme such as a fulleride (an example of which are carbon nanotubes) or polymer. The present invention may be particularly efficacious in non-Si-based semiconductors, due to difficulties in doping many semiconductors either n-type or p-type. Furthermore, semiconductors with smaller bandgaps may gain more advantage with this approach, due to a greater range of available workfunctions outside the semiconductor bandgap. For example, if a smaller-bandgap semiconductor has a greater electron affinity than a reference semiconductor, a low-workfunction metal may induce more charge in the low-bandgap semiconductor than, in an otherwise similar configuration, than it would in the reference semiconductor. Ge and C nanotubes, for example, each have both a relatively small bandgap and increased doping difficulties relative to Si.

The metal overlapping the extension region in an n-channel device may consist of a pure metal such as Y, Mg, Yb, Er, Cs, Rb, Ba, Ca, Ce, Eu, Gd, K, La, Li, Lu, Na, Nd, Sc, Sm, Sr, Tb, Th, or Tl. These metals all have workfunctions generally lower than the electron affinity of many of the semiconductors mentioned above, in particular Si and Ge and alloys of Si and Ge. For a p-channel device, the metal overlapping the extension region may be a pure metal such as Ir, Pt, Se, Au for certain crystallographic surfaces such as {001}, or {111} Pd crystallographic surfaces. These metal surfaces have workfunctions generally greater than one bandgap more than the electron affinity of many of the above semiconductors, in particular Si and Ge and alloys of Si and Ge.

In other embodiments, the metal overlapping the extension region may be an alloy of one of the above metals and another metal. Alloys may be desirable, for example, for their process characteristics such as etch resistance or thermal stability. Alloys also possess a workfunction that is generally different than that of either of the component metals. For example, the workfunction of the alloy may be a weighted average of the workfunction of the component metals. The workfunction of the alloy may also be higher or lower than either of the component metals. Thus, alloys may be advantageous for tuning a workfunction to a value not available from elemental metals. Alternatively, or in addition, in some cases the metal may be a compound with a semiconductor. An example of such a compound is a metal silicide, such as metal silicides formed from Si and one or a combination of erbium (Er), platinum (Pt), iridium (Ir), magnesium (Mn), titanium (Ti), hafnium (Hf), zirconium (Zr), niobium (Nb), vanadium (V), tungsten (W), cobalt (Co), tantalum (Ta), chromium (Cr), molybdenum (Mo), iron (Fe), rhenium (Re), rhodium (Rh), gadolinium (Gd), yttrium (Y), palladium (Pd), osmium (Os), and nickel (Ni).

In still further embodiments, the metal over the extension region may be different than the metal used to contact the source/drain region. For example, the metal over the source/drain regions may be $NiSi_x$ or $ErSi_x$, while the metal over the extension region may be Yb or Er, in an n-channel FET.

In other embodiments, the metal overlapping the extension region may be layered of two or more different metals. The metal in contact with the insulator over the extension region determines the amount of induced charge. The metal (s) not at the interface with the insulator may be used due to fabrication issues. For example, a different metal than that in contact with the insulator may serve as a protection layer from the environment encountered during subsequent fabrication, or as an adhesion layer, or as an "etch-stop" or "etch-resistance" layer.

Further embodiments of the present invention provide an extension region in the semiconductor of various dopant concentrations, from undoped to heavily doped, in combination with a metal overlapping an insulator in contact with the semiconductor in the extension region. Variations of geometry of the lateral extent of this doping are also possible. For example, the dopant in the extension region may occupy only half of the extension region, extending from the heavily doped source halfway into the extension region, but not reaching the channel region under the gate. In this case the dopants may extend deeper into the semiconductor than does the induced charge layer. Thus, the depth of electrical conduction is reduced in two steps from the doped source to the channel. This may maximize drive current while minimizing short-channel effects. Or, the doping may extend all the way to the channel, yet be of lower concentration than would be needed for comparable extension conductance without the use of the overlap metal.

Examples of insulators which may be used to separate the conductor from the extension region include, but are not limited to, $SiO_2$, $SiO_x$, $Si_3N_4$, $SiN_x$, $SiO_xN_y$, $HfO_2$, $GeO_2$, $GeO_x$, $GeO_xN_y$, $ZrO_x$, $HfSi_xO_y$, $Ge_xSi_yO_z$, $Ge_xSi_yO_zN_w$, and rare earth oxides, where in the preceding, x, y, z, and/or w may take any real positive value. Combinations of the above materials, including bilayers, multilayers, and alloys, may also be used.

In a further embodiment, which differs significantly from the above, the present invention may be utilized in FETs with a metal source and/or drain region. In such a structure, the type of the FET (n-channel, p-channel, or ambipolar) is determined by the workfunction of the S/D metal(s), rather than on the doping in the S/D region. These transistors are referred to as "Schottky barrier" (for direct metal/semiconductor contacts) or "metal S/D" (including also the case of an ultra-thin interfacial layer at the metal/semiconductor interface) FETs. In the present invention, a metal extends from the metal source/drain region to over the extension region of the semiconductor. If the workfunction is sufficiently low (high) for n-channel (p-channel) FETs, the virtual extension acts as a low-resistance link between the metal source/drain and the channel. In addition, this approach reduces the resistance between the metal source/drain region and the extension region. The resistance is reduced because the tunnel barrier resulting from the Schottky barrier at the metal/semiconductor junction is reduced in thickness. This is due to the increased charge density, and thereby the increased electric field, in the vicinity of the metal/semiconductor contact. Designers of Schottky-barrier MOSFETs have to date attempted to reduce this resistance by overlapping the gate with the metal-semiconductor junction. Then, as the gate is turned on, charge induced in the channel thins the remaining Schottky barrier (which acts as a tunnel barrier) in the on-state. However, gate-to-source/drain overlap results in increased short-channel effects and load capacitance, reducing circuit performance. In the present invention, a low metal workfunction acts like a large positive gate voltage over the extension region, while a high metal workfunction acts like a large negative gate voltage over the extension region.

The workfunction, in n-channel MOSFETs for example, is desirably lower than the Fermi level in the channel minus the difference between on-state gate voltage and the threshold voltage of the channel. This ensures that the charge induced in the extension is at least as much as would have been induced in the on-state by the gate. As the peak gate voltage (the "supply voltage") is lowered, the technique of overlapping the gate with the metal/semiconductor junction becomes less effective, whereas the present overlapping extension technique remains effective at reduced gate voltages.

The gate voltage dependence of the electric field at the metal/semiconductor interface, when the gate overlaps the metal/semiconductor interface at the source and/or drain, may affect the manner in which the transistor turns on. For an n-channel MOSFET, at gate voltages near the threshold voltage, the charge density near the interface will be relatively small. As the gate voltage is increased beyond the threshold voltage, the charge density near the interface will increase, and with it the electric field near the interface will strengthen. This increasing electric field reduces the resistance associated with the metal/semiconductor interface. For gate voltages only slightly above the threshold voltage, the resistance of these interface(s) is relatively large, and therefore current is relatively suppressed until the gate voltage is close to its maximal value well above the threshold voltage. On the other hand, with the present invention, the electric field near the metal/semiconductor interface is relatively high for all gate voltages. Therefore, the resistance associated with the metal/semiconductor interface is relatively low for even gate voltages only slightly above the threshold voltage. As expected for an ideal MOSFET, the resistance between the source and the drain is dominated by the channel resistance. The transistor thus provides relatively high current across a wider range of gate voltages when compared to a transistor with gate-to-source/drain overlap.

A further disadvantage of overlapping the gate with the metal/semiconductor junction is, for a given source-to-drain separation, the resulting increase in gate length relative to the case where there is no gate overlap of the metal/semiconductor junction, increases gate capacitance. On the other hand, if gate length is fixed relative to the case where there is no gate overlap of the metal/semiconductor junction, the resulting decreased source-to-drain separation results in worsened "short-channel effects", possibly including a degraded "sub-threshold slope".

Examples of some of the above-described options are shown in FIG. 8. In the three examples shown in Illustrations 8(a), 8(b) and 8(c), the metal in the overlap region may or may not be the same metal at the S/D contact. In 8(a), transistor 132 has no doping for the S/D 134, and thus this is a "metal S/D" or "Schottky S/D" device. The virtual extension 136 is induced by the effective workfunction of the portion of the metal S/D 138 that overlaps the semiconductor in the extension region 136. In 8(b), transistor 140 has doping used only at the S/D-semiconductor contact 142, with the virtual extension 144 replacing a doped extension, and providing a link in the current path to the channel 146. In 9(c), transistor 148 has doping along the entire region 150 between the metal/semiconductor contact 150 and the channel 152, but the virtual extension 154 supplements the doping, increasing the conductivity of the region and reducing extrinsic device resistance.

It is important to note that in the prior discussion of metal source/drain FETs, and in the discussion that follows, metal/semiconductor contact(s) may have an ultra-thin insulator at the interface between the metal and the semiconductor, such that the metal/insulator/semiconductor junction has a suitably low contact resistance. See D. E. Grupp U.S. Pat. No. 6,198,113; D. E. Grupp and D. Connelly, "Electrostatically Isolated Tunneling Transistor," 2000; D. Connelly, et al.; 2003 Si Nanotech. Symp.; pp. 122–123, each incorporated herein by reference.

Many different geometries of this insulator are possible. In one embodiment the insulator in the extension region is the same thickness as the gate insulator over the channel. This may simplify manufacture, as both the insulator in the extension region and the insulator over the channel region may be fabricated simultaneously.

In yet another embodiment, the insulator in the extension region is of a different thickness than is the insulator over the channel region forming the gate insulator. It may be advantageous, for example, to have the insulator in the extension region be thinner than the insulator over the gate. This results in greater induced charge in the extension region, which may improve the performance of the transistor. This may be accompanied by current from the overlapping metal through the insulator into the extension region by the quantum-mechanical process of tunneling. This extra current may also enhance performance.

It may also, in some embodiments, be advantageous to have an insulator over the extension region that is thicker than the insulator in the channel region. This may have the advantage of reducing the electrostatic coupling between the source/drain regions and the channel reducing what is referred to as "drain-induced barrier lowering". Fabrication considerations may also make a thicker extension insulator desirable.

Even neglecting the reasons for a thicker insulator mentioned in paragraph [0075], if the goal is to maximize the conductivity of the induced charge the extension region, the optimal insulator thickness may be non-zero. As the thickness is reduced below this value, for example, a greater fraction of the induced charge may, due to metal/semiconductor interactions that tend to "pin" the effective workfunction of the metal, fail to contribute proportionally to the conductance to the channel. The optimal thickness in a preferred embodiment, which may differ from the thickness of the insulator between the gate and the channel, will balance the total induced charge, and the degree to which that charge contributes to the conductance to the channel.

For example, if the pinning of the effective workfunction is due to the extension of electron states from the metal into the Si (Metal Induced Gap States (MIGS), see Tersoff, supra), and if these states are characterized by a quantum mechanical complex momentum that is principally real in the direction parallel to the semiconductor/insulator interface, but principally imaginary in the direction perpendicular to the interface, then it may be the case that this charge is capable of contributing to the conductivity parallel to the interface. Despite having a positive kinetic energy component in the plane parallel to the interface, a negative kinetic energy component perpendicular to the interface can result in this charge having a net energy within the semiconductor bandgap. In this case, charge induced in states within the gap may lower the resistance within the extension region, as does charge induced in the valence or conduction bands. However, there may be an energy difference between charge induced in the semiconductor bandgap in the extension region, and charge induced in the semiconductor valence or conduction bands in the channel. This energy difference may lead to a relatively high resistance component between the extension region and the channel. This resistance component should not be present for charges induced in the extension region in either the conduction or valence band, since they are at the same energy as the charges in the channel. Of course, other physical explanations and/or mechanisms may be responsible for the pinning of the effective metal workfunction over the extension region, and so the principle that an insulator of insufficient thickness may result in a reduction in charge that substantially contributes to the conductance between the source/drain and the channel is a relatively general one.

In one embodiment the insulator over the extension region may be silicon dioxide ($SiO_2$) or a related compound, such as $SiO_x$ (for some positive x) or $SiO_xN_y$ (for some positive x and y). Metals in contact with $SiO_2$ have been observed to exhibit workfunctions relatively close to their ideal values (Yeo, et al., supra, two references).

In another embodiment, the insulator in the extension region may be silicon nitride ($Si_3N_4$, or more generally $SiN_x$, for some positive x). The effective workfunctions of metals at their interface with silicon nitride have been observed to be somewhat further from their ideal value than are the effective workfunctions of the same metals when in contact with $SiO_2$ (Yeo, et al., supra, two references). The use of silicon nitride may be advantageous from a fabrication perspective, as the spacer between the overlap metal and the gate may also be silicon nitride. Then, the gate spacer and the extension insulator may be fabricated simultaneously.

In yet another embodiment, the extension insulator may have a dielectric constant much higher than that of $SiO_2$. This may be advantageous as for the same thickness as an $SiO_2$ layer, a greater amount of charge is induced in the extension region.

In yet another embodiment, the metal in the overlap region may be electrically isolated from both the source/drain and the gate, and unconnected to any voltage source in the circuit. This condition is called "floating".

In still another embodiment, the metal in the extension region extends to within a distance from the edge of the channel such that virtual extension forms a substantially continuous link to the channel edge. In a preferred embodiment, the metal should overlap the insulator to within less than approximately 15 nm of the edge of the channel. This separation allows fringing electric fields from the gate and from the low-workfunction metal to form a low-resistance linkage between the virtual extension and the channel.

Figure 9A:
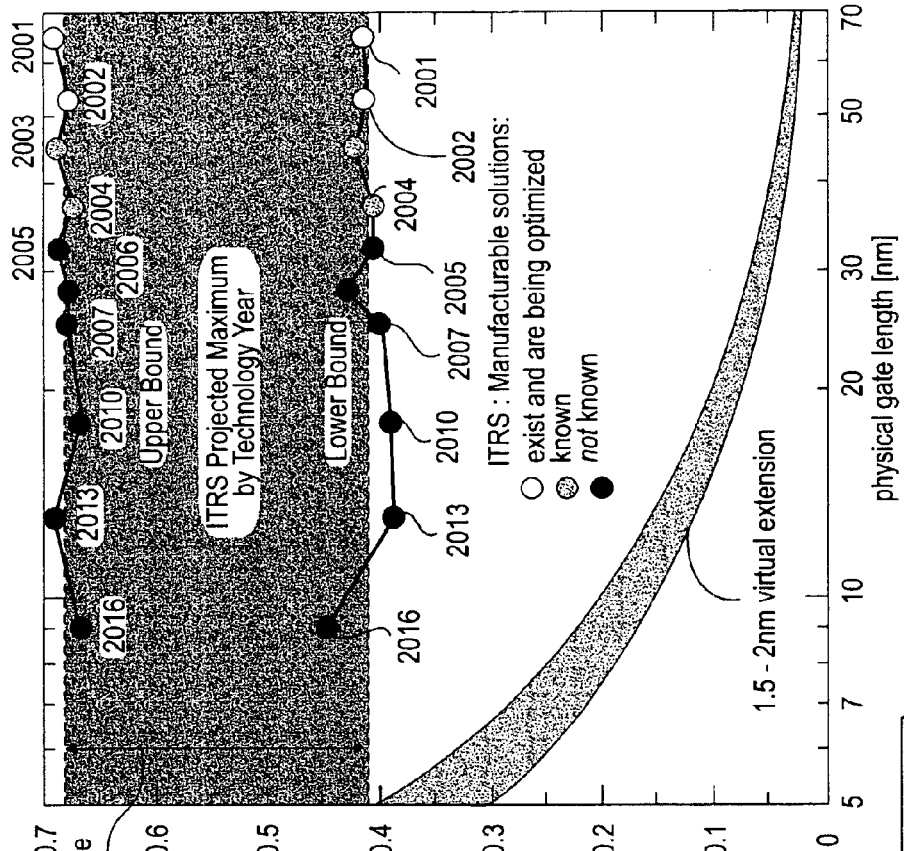
FIG. 9 shows a comparison of transistor parameters achievable with embodiments of the present invention and industry projections for such parameters over a number of years.
Figure 9B:
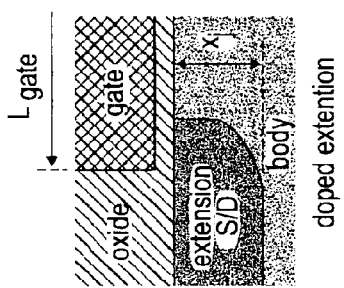
Figure 9C:
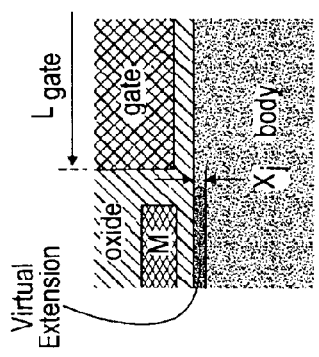
Figure 9:
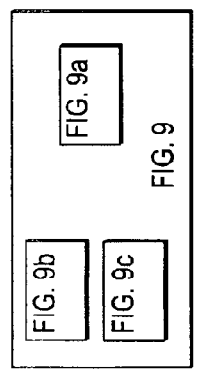

The advantage of a virtual extension created in accordance with the present invention becomes of clearer importance as gate length drops. The International Technology Roadmap for Semiconductors 2002 Update published by the Semiconductor Industry Association projects that the extension depth should be no more than approximately 55% the physical gate length. FIG. 9 compares this requirement with a 1.5 nm to 2 mm thick virtual extension. The plotted value is the ratio of the junction depth to the gate length. The shaded zone at the top of the graph projects the targets of the 2002 ITRS roadmap by technology year and the remaining band is the range of ratios for an approximately 1.5 nm to 2 nm thick virtual extension. As can be seen, the virtual extension provided by the present invention matches or exceeds the ITRS junction depth goals down to a physical gate length of approximately 3 nm to 4 nm, well beyond ITRS gate length projections.

Figure 10:
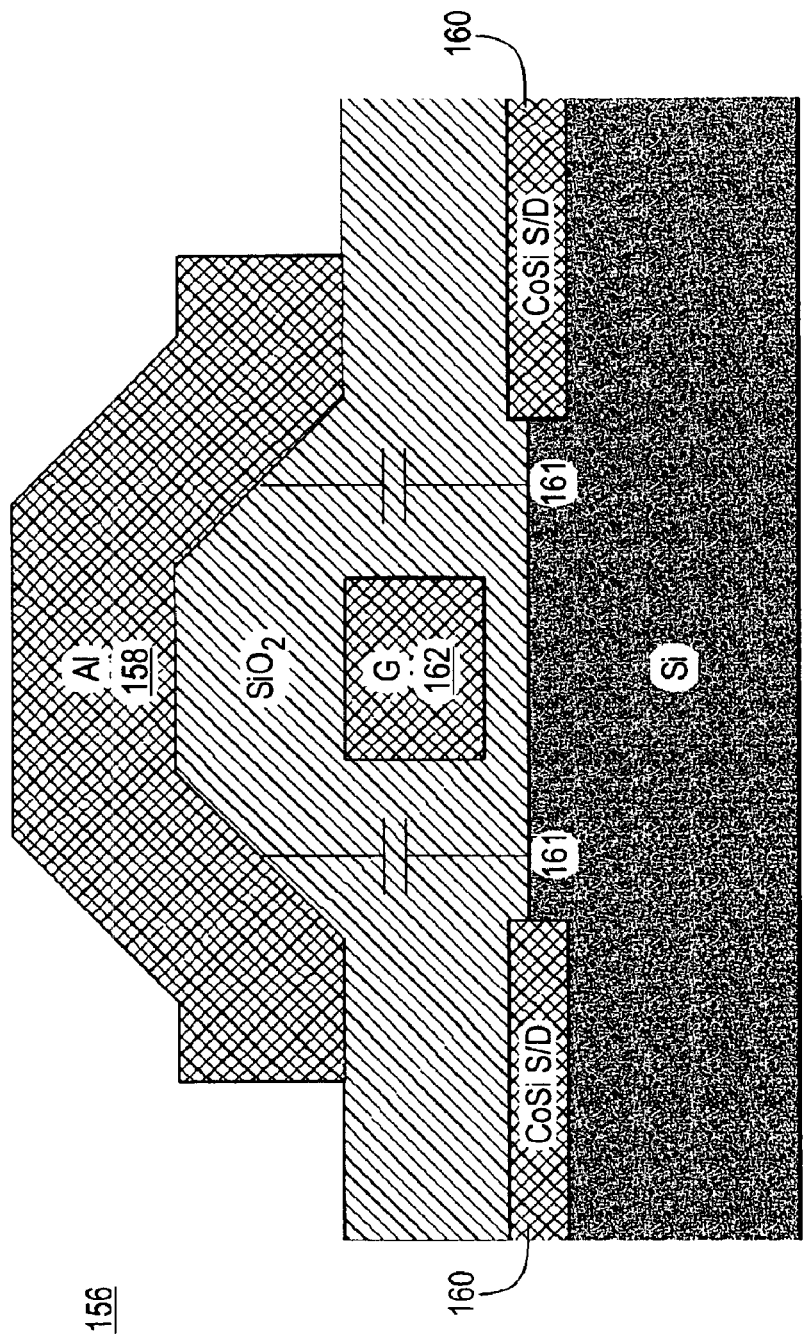
FIG. 10 illustrates an ambipolar Schottky source/drain FET having biased-induced extensions as reported by Lin et al.

At this point it should be noted that virtual extensions have previously been used with metal S/D MOSFETs. H. C. Lin et al., "Nano-Scale Implantless Schottky-Barrier SOI FinFETs with Excellent Ambipolar Performance", 2002 *Device Research Conference Digest*, pp. 45–46 (2002) described the use of a biased Al film placed over a Schottky S/D FinFET (a dual-gate MOSFET with channels formed on sidewalls of a silicon "fin") to form a bias-induced extension. A schematic from the paper is reproduced in FIG. 10. This device 156 is ambipolar, where either n-channel or p-channel performance can be achieved depending on whether electrons or holes are attracted to the Si surface 161 via a sufficiently positive (electrons) or negative (holes) bias on the Al overlayer 158. The CoSi S/D 160 has a mid-gap effective workfunction, and thus can conduct, albeit with substantial resistance, with either an induced electron or an induced hole layer. In addition to the problems with the S/D workfunction and with the ambipolar operation, the bias method of inducing a virtual extension results in a substantial capacitance between the source/drain 160, gate 162, and the Al overlayer 158.

The present approach differs substantially from that of Lin et al., in that in the present invention the effective workfunction of the metal is significantly outside the semiconductor bandgap. This is not the case for Al in contact with $SiO_2$ with Si as the reference semiconductor (as used by Lin et al.). The workfunction of Al is approximately 4.1 V, only near the edge of the Si gap, given the Si electron affinity of approximately 4.05 V. With a low (n-channel) or high (p-channel) workfunction, a bias is no longer needed to attract charge to the surface, providing the opportunity for reduced capacitance.

In accordance with the present invention, the formation of a layer of enhanced conductivity between the conductor/semiconductor S/D contact and the channel is then achieved, in preferred embodiments, using the following:

1. A conductor (often a metal) of the appropriate workfunction.
2. An insulator, between the conductor and the semiconductor, of the appropriate properties:
    a) The insulator is chemically stable with materials with which it is in contact for conditions encountered in subsequent fabrication and device operation.
    b) The insulator should form a high-quality interface with the semiconductor.
    c) The insulator should sufficiently de-pin the conductor's workfunction (see Y. C. Yeo et al., "Effects of high-k Gate Dielectric Materials on Metal and Silicon Gate Workfunctions", *IEEE Elec. Dev. Lett.*, vol. 23, pp. 342–344 (2002)).
    d) The insulator should be sufficiently thin and of sufficient permittivity to achieve sufficiently high capacitance between the conductor and the semiconductor. High capacitance effectively translates a low (n-channel FET) or high (p-channel FET) workfunction into a high charge density.
3. The conductor should overlap the insulator sufficiently close to the edge of the channel. In an example case, this proximity should be within approximately 15 nm of the edge of the channel (see Connelly et al., 2004 VLSI Symposium, supra). This separation allows fringing electric fields from the gate and from the low-workfunction metal to form a low-resistance linkage between the virtual extension and the channel.
4. The conductor should be sufficiently thin that it is not the source of excessive capacitance to the S/D and/or gate.
5. The conductor should be connected to the associated S/D, though alternative configurations include connecting the conductor to the gate, connecting the conductor to another reference potential, or allowing the conductor to float. If the conductor is connected to the gate, gate capacitance will be increased, and circuit speed will be reduced. This is not an approach recommended here. If the conductor is connected to a separate reference potential (as is done with the biased side-gate MOSFET shown in FIG. 1), the capacitance penalty will also likely be excessive, and circuit complexity will possibly be increased. Finally, if the conductor is allowed to float, "memory effects" are a concern, where the charge state of the conductor changes over time, dependent on the history of the applied voltages to the device.

In a well-designed FET, the primary source of resistance is the channel, which is controlled by the gate. Other sources of resistance should thus be small in comparison to the resistance of the channel. In a preferred embodiment, the present invention does not introduce sources of resistance large in comparison to the channel resistance.

Figure 11:
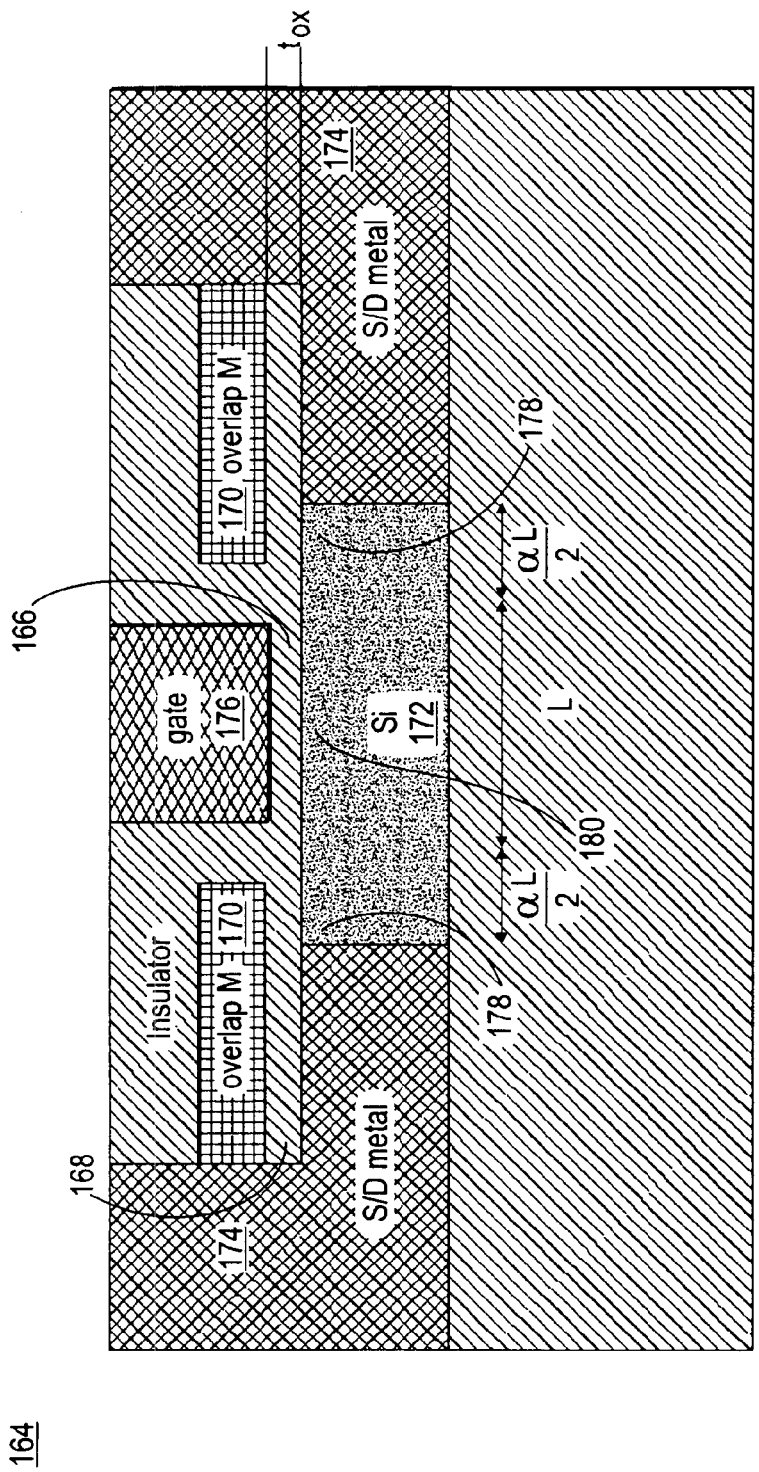
FIG. 11 illustrates a transistor configured in accordance with an embodiment of the present invention and highlights certain physical dimensions therefor.

Consider, for example, a symmetric, n-channel, ultra-thin-body, silicon-on-insulator MOSFET 164 with channel length L and virtual S/D extensions of length $\alpha L/2$, as shown in FIG. 11. The total virtual extension length is thus $\alpha L$. Assume the gate insulator 166 and the insulator 168 under the conducting material 170 responsible for forming the virtual extension are both $SiO_2$ with per-area capacitance of $C_{ox}$. Assume further that the Si 170 is essentially undoped throughout. The MOSFET 164 has metal S/D contacts 174 and a gate 176.

An illustrative approximation for the sheet charge density in the virtual extension 178 ($Q_x$) and in the channel 180 ($Q_c$) is as follows, where it is assumed the effective workfunction of the metal over the extension region $\Phi_x \geq X_e$, the electron affinity of the semiconductor in the extension and channel regions, and the gate voltage $V_G > X_e - \Phi_G$, where $\Phi_G$ is the workfunction of the gate electrode:

$$Q_C = C_{OX}(V_G + X_e - \Phi_G)$$

$$Q_X = C_{OX}(X_e - \Phi_X)$$

The resistance of these regions is in proportion to their length. Thus, the ratio of the resistance of the channel ($R_c$) to the resistance of the virtual extensions ($R_x$) is the following, where it is assumed the effective mobilities in the channel and in the extension are equal:

$$\frac{R_C}{R_X} = \alpha \frac{X_e - \Phi_X}{V_G + X_e - \Phi_G}$$

To evaluate this ratio, certain approximations can be used. For the channel, the threshold voltage, $V_T = \Phi_G - X_e$, should be at least approximately 0.3 volts (Y. Taur & T. Ning, *Fundamentals of Modern VLSI Design* (1998)). For the gate voltage, a characteristic value during circuit operation is 0.7 $V_{DD}$, where $V_{DD}$ is the supply voltage (see equation 5.38 of id., along with the following discussion). Assume a channel length to extension length ratio of 4:1, yielding $\alpha = 0.5$. Assume with these parameters, $R_c/R_x$ should be at least 2 (at least two-thirds of the resistance is in the channel). The only remaining parameter is $(X_e - \Phi_X)$, which is constrained thus:

$$X_e - \Phi_X \geq \frac{R_C}{R_X}(V_G - V_T)/\alpha$$

With the chosen values, this relation becomes:

$$X_e - \Phi_X \geq 0.7 V_{DD} - 0.3 V$$

Figure 12:
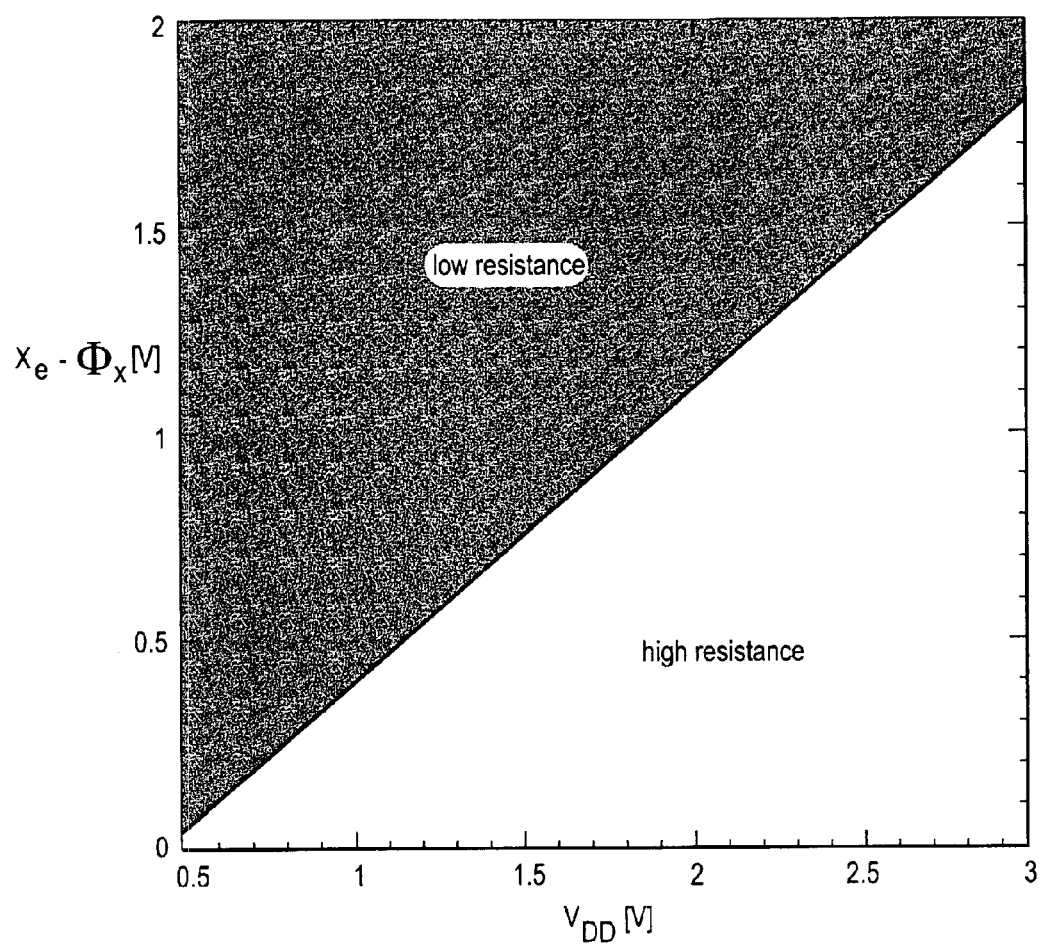
FIG. 12 is a graph illustrating a target separation between an extension metal's workfunction and a semiconductor's band edge as a function of supply voltage for an n-channel MOSFET configured in accordance with an embodiment of the present invention.

This result is plotted in FIG. 12, which shows the target separation between the workfunction of the extension conductor and the semiconductor band edge as a function of supply voltage to meet the virtual extension resistance criteria for the n-channel MOSFET. Note that while for supply voltages in excess of approximately 2 volts, the constraint on the metal workfunction is severe, as the supply voltage drops below 1.5 volts, the required $(X_e - \Phi_X)$ becomes less than 0.75 V, a range accessible with a wide range of metal/semiconductor combinations. Thinning or otherwise increasing the capacitance of the insulator under the overlap metal is a way to relax the constraint on $(X_e - \Phi_X)$. The constraint can be further relaxed by increasing the mobility in the induced extension, such as with strain (see paragraph [0057]).

Analysis of a p-channel MOSFET is similar, yielding:

$$\Phi_X - (X_e + E_G) \geq 0.7 V_{DD} - 0.3 V$$

Some sample structures configured in accordance with embodiments of the present invention are shown in FIG. 13. Regions are indicated by the type of material(s) of which they consist:

a) I: Insulators, such as $SiO_2$, $Si_3N_4$, $SiN_x$, $ZrO_2$, $HfO_2$, etc.

b) S: Semiconductors, such as Si, $Ge_x Si_{1-x}$, Ge, certain C-based materals, GaAs, etc.

c) M: Metals, such as Al, Er, Yb, Pt, Ir, Cu, Ag, Ar, W, Ni, NiSi, Co, CoSi, $ErSi_{1.7}$, PtSi, PtGe, certain forms of C, degenerately-doped semiconductors, etc. Each region may consist of one or more of these materials. The gate (G) may be a metal or a doped semiconductor.

A path of capacitive coupling is indicated with the capacitor symbol, "⊣⊢". The Illustrations (a)–(i) in FIG. 13 are for n-channel FETs. Thus, the metal at one end of the capacitor should have an effective workfunction less than the electron affinity of a semiconductor near the other end. If the FETs were p-channel, the metal end of the capacitor should have an effective workfunction more than a bandgap larger than the electron affinity of a semiconductor near the other end of the capacitor. The doping in the semiconductor regions is not specified; these geometries apply to both doped S/D and metal S/D designs. Not all of these transistors are considered by the present inventors to be optimal designs. However, each illustrates an example of the present invention.

(a) overlap: In this configuration, a low-workfunction metal 182 hangs over the extension region 184 in a parallel-plate capacitor orientation. This may be the most effective design.

(b) angled: Here, the overlap region 186 is not coplanar with the extension surface 188. This design may be preferred due to fabrication issues, for example.

(c) undercut: In this example, the coupling is from under a fully depleted semiconductor layer 190. The layer should be sufficiently thin so that the induced charge layer 192 is sufficiently linked to the channel 194, when the transistor is in the on state, to increase the conductivity to the channel.

(d) wrapped: This design is a combination of (a) and (b), with a low-workfunction metal (196, 200) overlapping a thin semiconductor layer 198 both above (196) and below (200). This design may be less preferred due to electrostatic coupling between the buried metal layer 200 and the channel 202, unless a dual-gate configuration is used (gates above and below the semiconductor film).

(e) floating: Here, the low-workfunction metal 204 is not connected to the S/D 206. This may be preferred due to fabrication issues.

(f) backplane: A metal layer 208 is below a buried oxide 210 under a fully depleted semiconductor film 212. This design may be preferred due to fabrication issues. Possible problems with this approach include capacitance associated with the backplane, and a reduced threshold voltage of the channel 214 relative to the case where the backplane metal 208 is either absent, or replaced with a metal with a larger workfunction. In a complementary process, with both n-channel and p-channel transistors on the same substrate, it may be desirable to omit the low-workfunction metal from under the p-channel FETs, possibly replacing it with a high-workfunction metal. This design differs from prior backplane designs, which had effective backplane workfunctions within, or at essentially the edge, of the semiconductor bandgap. For example, $p^+$ Si under an n-channel Si FET (W. Xiong & J. P. Colinge, "Self-aligned implanted ground-plane fully depleted SOI MOSFET", *Electronics Letters*, vol. 23, pp. 2059–2060 (1999)), an unspecified mid-gap metal under an n-channel Si FET (H. S. P. Wong et al., "Device design considerations for double-gate ground-plane and single-gated ultra-thin SOI MOSFET's at the 25 nm channel length generation", 1998 *IEEE IEDM Tech. Digest*, pp. 407–410 (1998)), or mid-gap metal silicide under an n-channel Si FET (J. S. Hamel et al., "Substrate crosstalk suppression capability of silicon-on-insulator substrates with buried ground planes (GPSOI)", *IEEE Microw. Guid. Wave Lett.*, vol. 4, pp. 134–135 (2000)). Reasons for the use of these other backplane designs include reducing short-channel effects and tuning the device threshold voltage with the backplane bias. Both of these reasons also apply to the backplane design shown in the figure.

(g) split backplane: This is a subset of case (f). Here, the backplane metal is split into two parts 216a and 216b, preferably with a process self-aligned to the gate, to have a lower workfunction under the extension region 218 than under the channel region 220, with the goal of changing the effect of the backplane on the transistor threshold voltage.

(h) partial backplane: here, the backplane metal 222 from (f) is restricted to a subset of the device, preferably exclusively under the extension region 224. The advantage of this approach is that, in addition to reducing the influence on the threshold voltage of the channel 226, the capacitance penalty is potentially reduced versus the version shown in (f).

(i) vertical FET: This shows an example of an asymmetric (i.e., the source and drain have different designs) vertical device. The body is formed of the central semiconductor region 228. At the top is a metal S/D, 230 with a doped S/D 232 on the bottom. The metal S/D 230 overlaps the central semiconductor 228 in the extension region 234. The structure may be axially symmetric, in which case it is a cylindrical, or "nanotube", or "pillar" FET. Or, it may have a square or near-square cross-section in the "vertical" plane. Or, it could be a fin geometry with the cross-section extending into the plane of the paper for a distance large relative to the semiconductor thickness.

Figure 14A:
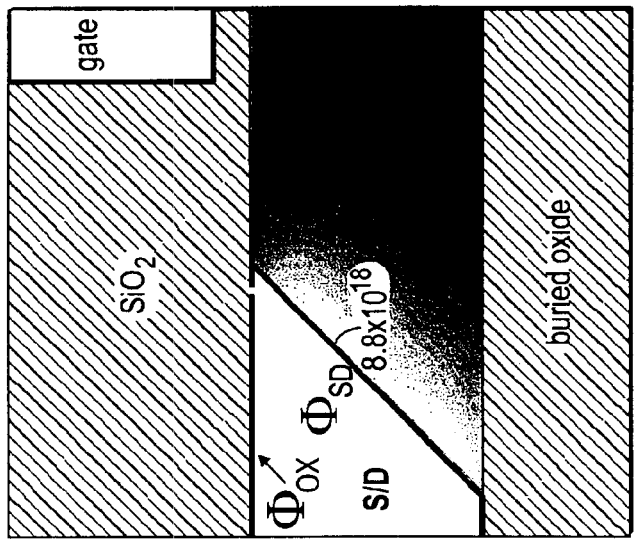
FIG. 14 provides a comparison of simulated electron density profiles for fully-depleted silicon-on-insulator n-channel MOSFETs with and without an overlap metal in accordance with embodiments of the present invention.
Figure 14B:
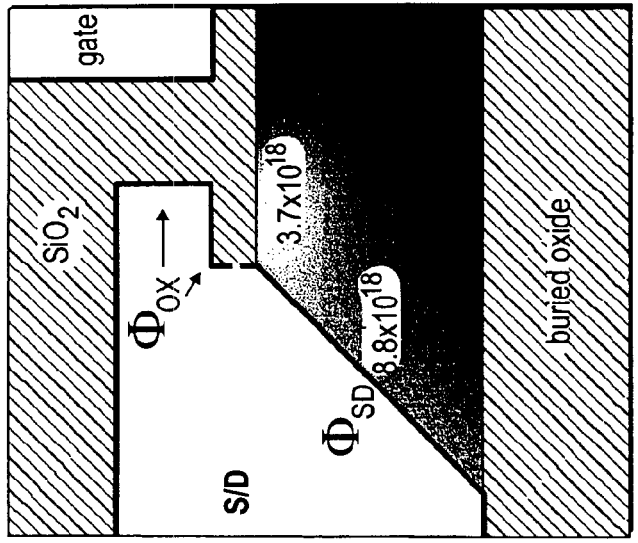
Figure 14:
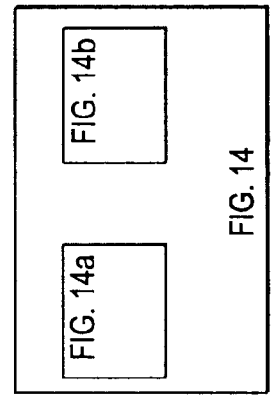

Simulations performed using the semiconductor device simulator Dessis 8.55 (URL: http://www.ise.com/) are shown in FIGS. 14 and 15. In all cases, the Si is lightly doped, and the device is in equilibrium (with the gate-to-source voltage of zero, an inversion layer is not present under the gate). In FIG. 14, a comparison is made between two metal S/D fully depleted silicon-on-insulator (FDSOI) n-channel MOSFETs, one with a low-workfunction metal overlapping the extension region (Illustration 14(b)), and the other without any metal overlap (Illustration 14(a)). In the simulation, the metal was assumed to have an effective workfunction at an interface with $SiO_2$ of $\Phi_{OX}$=3 V, and an effective workfunction at an interface with Si of $\Phi_{SD}$=4.05 V (the Si electron affinity). The silicon was modeled as lightly doped p-type, 7 nm thick. The gate insulator and insulator under the overlap metal were both specified as 1.3 nm of $SiO_2$. The electron profiles were compared for zero bias conditions. With the overlap, a high concentration of charge is evident (note the substantial inversion region of electrons due to electrostatic coupling from the overlap region in Illustration 14(b)). This charge substantially improves the transport of electrons from the metal S/D to the silicon, via the mechanism of thermionic field emission.

In FIG. 15, two FETs with overlap are compared. Device dimensions were specified as similar to those used for the FIG. 14 simulation. In one case (Illustration 15(a)), a low workfunction metal (effective workfunction of 3 V, well below the modeled Si electron affinity of 4.05 V) was used in the overlap region. In the other (Illustration 16(b)), the effective workfunction in the overlap region was limited to the Si electron affinity. With the lower workfunction metal a considerable accumulation of charge is observed, with a peak density of $1.5\times10^{19}/cm^3$. For the higher workfunction metal, however, the high charge density region fails to form.

Figure 16A:
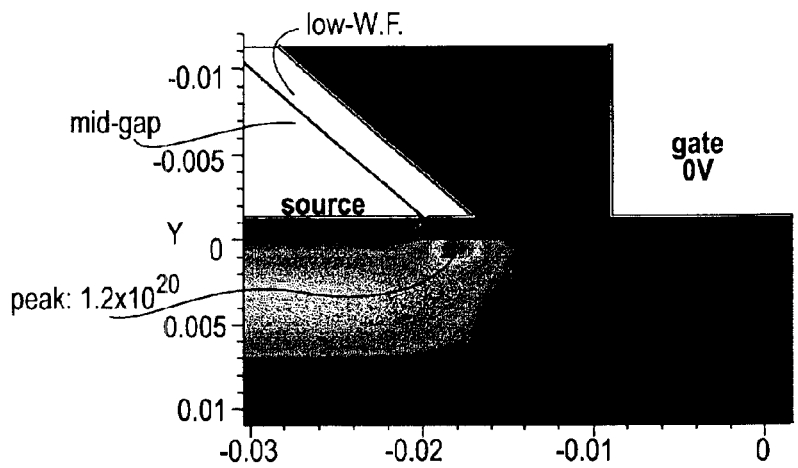
FIG. 16 provides a comparison of simulated electron density profiles for doped source/drain fully-depleted silicon-on-insulator n-channel MOSFETs. One device has a metal overlap in accordance with various embodiments of the present invention, while the other has an overlapping metal with an effective workfunction within the semiconductor bandgap.
Figure 16B:
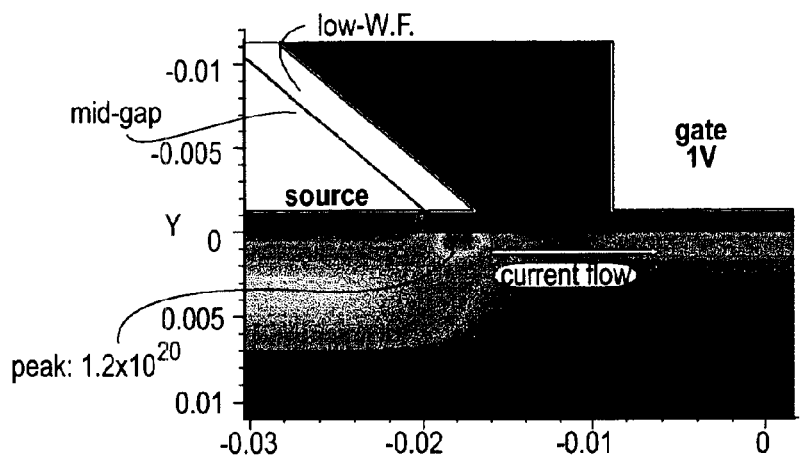
Figure 16C:
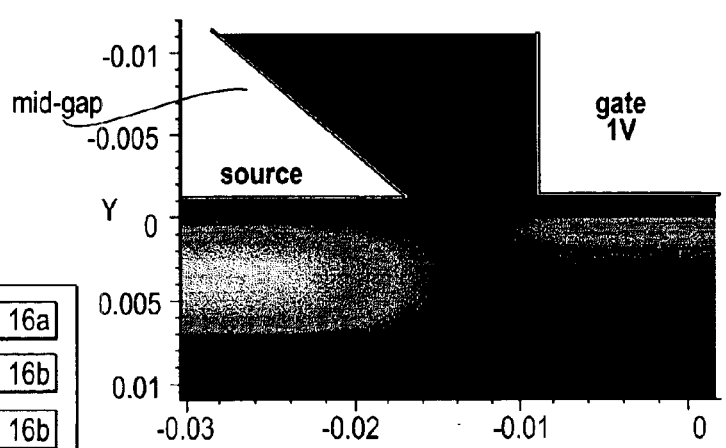

FIG. 16 shows a comparison of electron density profiles for doped S/D fully depleted silicon-on-insulator Si MOSFETs. It is assumed in the model that a mid-gap metal such as NiSi, CoSi, or TiSi (all of which are in common use in CMOS technology) is used to contact the doped S/D. Two options for an overlap metal are considered. In one (Illustrations 17(a) and 17(b)), the overlap metal has a low effective workfunction of 3V, well below the Si electron affinity. In the other case (Illustration 16(c)), a midgap metal having a workfunction of 4.6 V (well within the Si bandgap) is used for the overlap region.

As is evident in the results for the low-workfunction metal, there is the dramatic formation of a high-charge region (i.e., a virtual extension), with a peak electron concentration in excess of $10^{20}/cm^3$. This charge region is essentially independent of gate voltage, and thus acts like an extension with a thickness comparable to the inversion layer thickness, approximately 2 nm. In comparison, the 2002 Update of the ITRS Roadmap calls for an extension depth of 10–17 mm in 2007. As shown in Illustration 16(b), this virtual extension bridges the gap between the doped S/D (the deep region at the left of the figure) and the channel (the shallow region at the right of the figure). The result with the mid-gap overlap metal is shown in Illustration 16(c). There is no induced region of high density, resulting in an excessive gap between the S/D and the channel.

Thus, a transistor having a layer of charge induced in the conduction path between the channel and the source and/or drain by proximity to a conductor (e.g., a metal) possessing a workfunction outside of the bandgap of the semiconductor in the region in which the charge is induced has been described. In one embodiment of the present transistor there exists a region between one or more metal/semiconductor source/drain contacts, and the channel, in which the conductivity is enhanced by the proximity of a metal, electrically isolated from the gate and, in this region, separated from the semiconductor by an insulator, with an effective workfunction significantly outside of the bandgap of the semiconductor, for some semiconductor in the region between the metal/semiconductor contact and the channel. The semiconductor may be Si, Ge, or C, or alloys of any of these materials, or more generally, a compound or alloy of Group IIIA and Group VA elements, a compound or alloy of Groups IIA–B and Group VIA elements, a compound or alloy of Groups IIA–B, Group IIIA, Group IVA, Group VA, and/or Group VIA elements, a polymer, or another semiconductor material.

The effective workfunction of the metal responsible for the conductivity increase, at its interface with the insulator, may be at least 0.1 V outside the semiconductor bandgap, 0.2 V outside the semiconductor bandgap, at least 0.4 V outside the semiconductor bandgap, or at least 0.8 V outside the semiconductor bandgap.

The metal responsible for the conductivity increase may contain primarily one or more lanthanides (atomic numbers 57 through 70, inclusive), as determined by atomic fraction, one or more actinides (atomic numbers 89 through 102, inclusive), as determined by atomic fraction, or one or more rare earth elements (atomic numbers 57 through 70 inclusive, and 89 through 102 inclusive), as determined by atomic fraction. In some cases, the metal responsible for the conductivity increase may be Er, or an alloy of primarily Er (the element with the greatest atomic fraction is Er); Yb, or an alloy of primarily Yb (the element with the greatest atomic fraction is Yb); Mg, or an alloy of primarily Mg (the element with the greatest atomic fraction is Mg); Pt, or an alloy of primarily Pt (the element with the greatest atomic fraction is Pt); or Ir, or an alloy of primarily Ir (the element with the greatest atomic fraction is Ir). Alternatively, or in addition, the metal responsible for the conductivity increase may be a degenerately-doped n-type semiconductor, where the electron affinity of the semiconductor is significantly outside of the bandgap of some semiconductor in the extension region within the electrostatic influence of the degenerately-doped semiconductor, or a degenerately-doped p-type semiconductor, where the sum of the electron affinity and the bandgap of the semiconductor is significantly outside of the bandgap of some semiconductor in the extension region within the electrostatic influence of the degenerately-doped semiconductor.

In some cases, the metal responsible for the conductivity increase may be electrically connected to the metal/semiconductor source/drain contact, where the metal/semiconductor contact may have an ultra-thin (as defined in above) interfacial insulator. The metal responsible for the conductivity increase, although in electrical contact with this metal/semiconductor interface, need not be the same metal as that at the metal/semiconductor interface. The metal responsible for the conductivity increase may be "floating", not electrically connected to any other part of the device or circuit. The metal at the metal/semiconductor contact may be an alloy or compound consisting primarily of the metal responsible for the conductivity and of the semiconductor. This alloy or compound may be formed by depositing the low or high workfunction metal, then chemically reacting it with the semiconductor, leaving unreacted metal in the region to induce charge in the extension region. The conductivity may be assumed to be substantially enhanced if the resistance between the channel and the S/D metal is at least 10% lower relative to the reference case where the metal responsible for the conductivity increase is replaced with one with a workfunction truncated to the most restrictive band edge (highest affinity conduction band, lowest affinity valence band) of a semiconductor in the extension region between the source/drain and the channel. Or, as above with the exception that the resistance between the channel and the S/D metal is no more than half that of the reference case. The conductivity may alternatively, or in addition, be assumed to be substantially enhanced if, in some part of the extension region between the channel and the metal/semiconductor source/drain contact, the semiconductor in equilibrium is in a state of strong inversion of the carrier of the same type as forms the channel, in equilibrium, while if the metal is replaced with one with a workfunction truncated to the most restrictive band edge (highest affinity conduction band, lowest affinity valence band) of a nearby semiconductor, in the extension region, in a state of inversion, then the state of inversion, of the carrier of the same type as forms the channel, no longer exists in equilibrium at the same location. Alternatively, the conductivity may be assumed to be substantially enhanced if, in some part of the extension region between the channel and the metal/semiconductor source/drain contact, the semiconductor in equilibrium is in a state of strong accumulation of the carrier of the type as forms the channel, in equilibrium, while if the metal is replaced with one with a workfunction truncated to the most restrictive band edge (highest affinity conduction band, lowest affinity valence band) of a nearby semiconductor, in the extension region, in a state of accumulation, then the state of strong accumulation no longer exists in equilibrium at the same location. In some cases, the conductivity may be assumed to be substantially enhanced if, in some part of the extension region between the channel and the metal/semiconductor source/drain contact yet no further from the channel than from the source/drain contact, electrostatic analysis indicates the concentration of the channel carrier is enhanced by at least a factor of three above that which would be present if the metal were replaced with one with a workfunction truncated to the most restrictive band edge (lowest energy conduction band, highest energy valence band) of a nearby semiconductor in the state of strong inversion or strong accumulation. Or, the conductivity may be assumed to be enhanced if, at some point in the extension region between the metal/semiconductor S/D contact and the channel, and no further from the channel than from the S/D contact, electrostatic analysis indicates the per-area density of the charge due to the electrostatic coupling in equilibrium is at least as great as the per-area charge in the middle of the channel when the gate voltage is the average of the on-state gate voltage and the off-state gate voltage used in a characteristic application of the device.

In various embodiments, the transistor may be an n-channel MOSFET, and the metal responsible for the conductivity increase has a workfunction less than the electron affinity of some semiconductor in the extension region; or a p-channel MOSFET, and the metal responsible for the conductivity increase has a workfunction more than a bandgap larger than the electron affinity of some semiconductor in the extension region.

What is claimed is:

1. A transistor, comprising a layer of induced charge in a conduction path between a semiconductor channel and a channel tap, the conduction path being proximate to a conductor locally insulated from the layer of induced charge, which conductor is further insulated from a gate of the transistor and possesses a workfunction outside of a bandgap of a semiconductor in a region of the transistor in which the charge is induced.

2. The transistor of claim 1, wherein conductivity between the semiconductor channel and the channel tap is enhanced by at least approximately 10% relative to a reference case where the conductor has a workfunction within or at a boundary of the bandgap of the semiconductor in the region of induced charge.

3. The transistor of claim 1, wherein the channel tap comprises a doped source/drain contact.

4. The transistor of claim 1, wherein the channel tap comprises a metal source/drain contact.

5. The transistor of claim 1, wherein the channel tap comprises a Schottky source/drain contact.

6. The transistor of claim 3, wherein the semiconductor channel is made of a semiconductor selected from a list comprising: Si, Ge, C, or alloys of Si, Ge and/or C.

7. The transistor of claim 3, wherein the semiconductor channel is made of a semiconductor selected from a list comprising: a compound of Group IIIA and Group VA elements, an alloy of Group IIIA and Group VA elements, a compound of Groups IIA–B and Group VIA elements, an alloy of Groups IIA–B and Group VIA elements, a compound of Groups IIA–B, Group IIIA, Group IVA, Group VA, and/or Group VIA elements, or an alloy of Groups IIA–B, Group IIIA, Group IVA, Group VA, and/or Group VIA elements.

8. The transistor of claim 3, wherein the semiconductor channel is made of a semiconducting polymer, fulleride, or other molecular carbon-based material.

9. The transistor of claim 5, wherein the semiconductor channel is made of a semiconductor selected from a list comprising: Si, Ge, C, or alloys of Si, Ge and/or C.

10. The transistor of claim 5, wherein the semiconductor channel is made of a semiconductor selected from a list comprising: a compound of Group IIIA and Group VA elements, an alloy of Group IIIA and Group VA elements, a compound of Groups IIA–B and Group VIA elements, an alloy of Groups IIA–B and Group VIA elements, a compound of Groups IIA–B, Group IIIA, Group IVA, Group VA, and/or Group VIA elements, or an alloy of Groups IIA–B, Group IIIA, Group IVA, Group VA, and/or Group VIA elements.

11. The transistor of claim 5, wherein the semiconductor channel is made of a semiconducting polymer, fulleride, or other molecular carbon-based material.

12. The transistor of claim 1, wherein the conductor is electrically connected to the channel tap.

13. The transistor of claim 3, wherein the conductor is electrically connected to the channel tap.

14. The transistor of claim 5, wherein the conductor is electrically connected to the channel tap.

15. The transistor of claim 6, wherein the conductor is electrically connected to the channel tap.

16. The transistor of claim 7, wherein the conductor is electrically connected to the channel tap.

17. The transistor of claim 8, wherein the conductor is electrically connected to the channel tap.

18. The transistor of claim 9, wherein the conductor is electrically connected to the channel tap.

19. The transistor of claim 10, wherein the conductor is electrically connected to the channel tap.

20. The transistor of claim 10, wherein the conductor is electrically connected to the channel tap.

21. The transistor of any of claims 1, or 3–20 inclusive, wherein the conductor has a workfunction no greater than 0.2 volts below an electron affinity of the semiconductor in the region of the transistor in which the charge is induced.

22. The transistor of any of claims 1, or 3–20 inclusive, wherein the conductor has a workfunction no greater than 0.4 volts below an electron affinity of the semiconductor in the region of the transistor in which the charge is induced.

23. The transistor of any of claims 1, or 3–20 inclusive, wherein the conductor has a workfunction no greater than 0.8 volts below an electron affinity of the semiconductor in the region of the transistor in which the charge is induced.

24. The transistor of any of claims 1, or 3–20 inclusive, wherein the conductor has a workfunction no greater than 1.6 volts below an electron affinity of the semiconductor in the region of the transistor in which the charge is induced.

25. The transistor of any of claims 1, or 3–20 inclusive, wherein the conductor has a workfunction no less than 0.2 volts more than a bandgap greater than an electron affinity of the semiconductor in the region of the transistor in which the charge is induced.

26. The transistor of any of claims 1, or 3–20 inclusive, wherein the conductor has a workfunction no less than 0.4 volts more than a bandgap greater than an electron affinity of the semiconductor in the region of the transistor in which the charge is induced.

27. The transistor of any of claims 1, or 3–20 inclusive, wherein the conductor has a workfunction no; less than 0.8 volts more than a bandgap greater than an electron affinity of the semiconductor in the region of the transistor in which the charge is induced.

28. The transistor of any of claims 1, or 3–20 inclusive, wherein the conductor has a workfunction no less than 1.6 volts more than a bandgap greater than an electron affinity of the semiconductor in the region of the transistor in which the charge is induced.

29. The transistor of any of claims 1, or 3–20 inclusive, wherein a first insulator which separates the conductor from the layer of induced charge has a first thickness less than or approximately equal to twice a second thickness of a second insulator which separates the gate from the semiconductor channel.

30. The transistor of any of claims 1, or 3–20 inclusive, wherein a first insulator which separates the conductor from the layer of induced charge has a first per-area capacitance greater than or approximately equal to half a second per-area capacitance of a second insulator which separates the gate from the semiconductor channel.

31. The transistor of any of claims 1, or 3–20 inclusive, wherein the conductor is a metal consisting primarily of one or more rare earth elements, as determined by atomic fraction.

32. The transistor of any of claims 1, or 3–20 inclusive, wherein the conductor is Er, or an alloy of primarily Er, as determined by atomic fraction.

33. The transistor of any of claims 1, or 3–20 inclusive, wherein the conductor is Yb, or an alloy of primarily Yb, as determined by atomic fraction.

34. The transistor of any of claims 1, or 3–20 inclusive, wherein the conductor is Mg, or an alloy of primarily Mg, as determined by atomic fraction.

35. The transistor of any of claims 1, or 3–20 inclusive, wherein the conductor is Pt, or an alloy of primarily Pt, as determined by atomic fraction.

36. The transistor of any of claims 1, or 3–20 inclusive, wherein the conductor is Ir or an alloy of primarily Ir, as determined by atomic fraction.

37. The transistor of any of claims 1, or 3–20 inclusive, wherein the conductor is a degenerately-doped n-type semiconductor.

38. The transistor of any of claims 1, or 3–20 inclusive, wherein the conductor is a degenerately-doped p-type semiconductor.

39. The transistor of any of claims 1, or 3–20 inclusive, wherein the conductor is configured to induce strain in the region of the transistor in which the charge is formed.

40. A device of claim 39, wherein the induced strain enhances effective carrier mobility in the region of the transistor in which the charge is formed.

41. A method, comprising inducing a layer of charge in a conduction path of a transistor between a semiconductor channel and a channel tap, the conduction path being proximate to a conductor locally insulated from the layer of induced charge and from a gate of the transistor, the conductor possessing a workfunction outside of a bandgap of a semiconductor in a region of the transistor in which the charge is induced.

* * * * *